United States Patent
Yildirim et al.

(10) Patent No.: US 10,615,746 B2
(45) Date of Patent: Apr. 7, 2020

(54) METHOD AND APPARATUS FOR MULTI-BAND VOLTAGE-CONTROLLED OSCILLATOR (VCO) BAND SELECTION

(71) Applicant: Cavium, LLC, Santa Clara, CA (US)

(72) Inventors: Omer O. Yildirim, Marlborough, MA (US); JingDong Deng, Acton, MA (US); Scott E. Meninger, Groton, MA (US)

(73) Assignee: Cavium, LLC, Santa Clara, CA (US)

( * ) Notice: Subject to any disclaimer, the term of this patent is extended or adjusted under 35 U.S.C. 154(b) by 226 days.

(21) Appl. No.: 15/825,942

(22) Filed: Nov. 29, 2017

(65) Prior Publication Data

US 2019/0165731 A1  May 30, 2019

(51) Int. Cl.
| | |
|---|---|
| *G01R 23/00* | (2006.01) |
| *H03B 5/12* | (2006.01) |
| *H03L 7/091* | (2006.01) |
| *H03L 7/099* | (2006.01) |

(52) U.S. Cl.
CPC ......... *H03B 5/1243* (2013.01); *H03B 5/1212* (2013.01); *H03B 5/1215* (2013.01); *H03B 5/1265* (2013.01); *H03L 7/091* (2013.01); *H03L 7/099* (2013.01)

(58) Field of Classification Search
CPC .. H03B 5/1243; H03B 5/1212; H03B 5/1265; H03B 5/1215; H03L 7/091; H03L 7/099
USPC ......................................................... 331/44
See application file for complete search history.

(56) References Cited

U.S. PATENT DOCUMENTS

| | | | |
|---|---|---|---|
| 6,091,304 A | 7/2000 | Harrer | |
| 7,295,078 B2 * | 11/2007 | Coppola | ................. H03L 7/099 331/179 |
| 9,087,567 B2 | 7/2015 | Yildirim et al. | |
| 9,413,568 B2 | 8/2016 | Yildirim et al. | |
| 9,496,012 B2 | 11/2016 | Yildirim et al. | |
| 9,673,753 B1 | 6/2017 | Yildirim et al. | |
| 2008/0048788 A1 * | 2/2008 | Yu | ........................... H03L 7/087 331/16 |
| 2009/0003503 A1 | 1/2009 | Banin | |
| 2018/0088536 A1 * | 3/2018 | Kurashina | ................. H03L 7/18 |

* cited by examiner

*Primary Examiner* — Richard Tan
(74) *Attorney, Agent, or Firm* — Hamilton, Brook, Smith & Reynolds, P.C.

(57) ABSTRACT

A method and apparatus select an optimal frequency band of a plurality of frequency bands of a multi-band voltage-controlled oscillator (VCO) to achieve a particular output frequency from the multi-band VCO. The optimal frequency band is selected, automatically, based on performing a one-point calibration phase followed by a multi-point calibration phase. The one-point calibration phase produces an initial frequency band selection and the multi-point calibration phase selects the optimal frequency band from a group of frequency bands including the initial frequency band selection, a higher frequency band consecutively higher in frequency relative to the initial frequency band selection, and a lower frequency band consecutively lower in frequency relative to the initial frequency band selection.

38 Claims, 11 Drawing Sheets

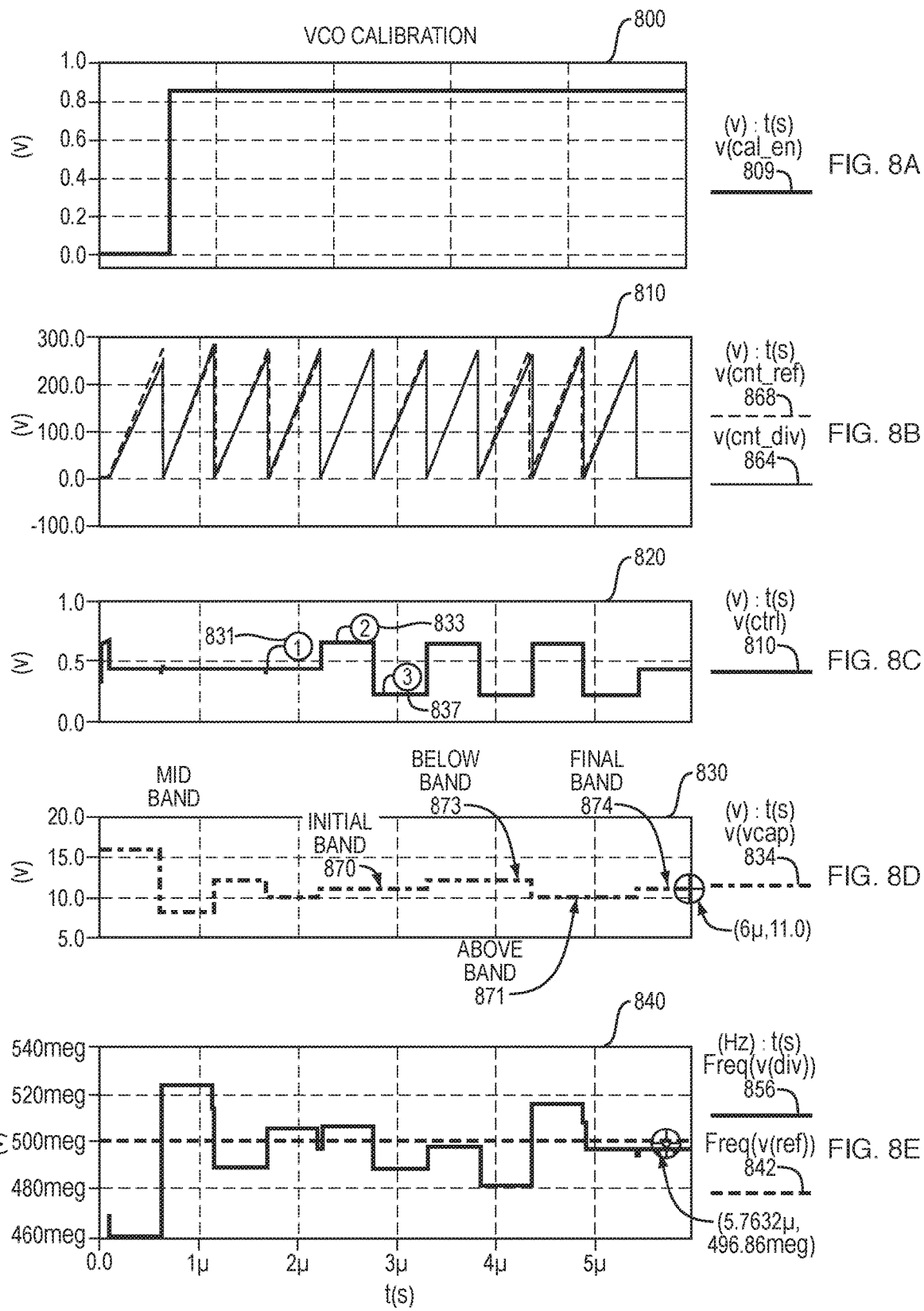

METHOD AND APPARATUS FOR MULTI-BAND VOLTAGE-CONTROLLED OSCILLATOR (VCO) BAND SELECTION

BACKGROUND

A voltage-controlled oscillator (VCO) is a device typically used in phase-locked loop (PLL) circuits to provide an output clock signal that is phase locked to a reference clock signal. The VCO has an output frequency that can be adjusted by varying a control voltage input. The voltage-to-frequency gain of the VCO specifies an amount of frequency change that results from a given change in the control voltage input. The voltage-to-frequency gain, also referred to interchangeably herein as tuning slope, is typically represented by the symbol "Kv" and expressed in units of Hz/V.

In higher performance VCOs, it may be useful to have lower gain while maintaining wide frequency coverage. In order to accomplish this, a VCO frequency coverage range may be divided into several sub-bands, where each sub-band covers part of the whole range. A VCO with the VCO frequency coverage range divided into several sub-bands may be referred to interchangeably herein as a multi-band VCO. A sub-band of the several sub-bands may be selected before a PLL locks the multi-band VCO to the reference clock signal.

SUMMARY

According to an example embodiment, a circuit may comprise a multi-band voltage controlled oscillator (VCO) having a plurality of frequency bands. The multi-band VCO may be configured to receive an input control voltage and produce an output signal with a target frequency. The circuit may comprise calibration logic configured to perform a calibration of the multi-band VCO to select an optimal frequency band from among the plurality of frequency bands. The calibration may include a one-point calibration phase employing a single input control voltage value for the input control voltage followed by a multi-point calibration phase employing multiple input control voltage values for the input control voltage. The optimal frequency band may be selected as optimal for enabling the multi-band VCO to produce the output signal with the target frequency.

The multi-point calibration phase may be a two-point calibration phase that employs two input control voltage values for the input control voltage. The two input control voltage values may include a higher voltage value and a lower voltage value. The higher voltage value may be higher in voltage relative to the single input control voltage value employed in the one-point calibration phase and the lower voltage value may be lower in voltage relative to the single input control voltage value.

In the one-point calibration phase, the calibration logic may be configured to converge on an initial frequency band of the plurality of frequency bands with the input control voltage maintained at the single input control voltage value. In the multi-point calibration phase, the calibration logic may be configured to select the optimal frequency band from among the initial frequency band converged on in the one-point calibration phase, a higher neighboring frequency band, and a lower neighboring frequency band. The higher neighboring frequency band may be consecutively higher in frequency relative to the initial frequency band and the lower neighboring frequency band may be consecutively lower in frequency relative to the initial frequency band.

In the one-point calibration phase, the calibration logic may be further configured to converge on the initial frequency band using a search criterion.

The search criterion may be a binary search. In the one-point calibration phase, the calibration logic may be further configured to begin with a given frequency band of the plurality of frequency bands prior to the binary search. The given frequency band may be located midway between a highest frequency band and lowest frequency band in a range of frequency bands of the plurality of frequency bands.

In the multi-point calibration phase, the calibration logic may be configured to set a given frequency band of the plurality of frequency bands to each of the initial frequency band converged on in the one-point calibration phase, the lower neighboring frequency band, and the higher neighboring frequency band in combination with the input control voltage set to the higher voltage value and the input control voltage set to the lower voltage value.

The multi-band VCO may include a digital capacitor bank that may act as a variable capacitor. In the one-point and the multi-point calibration phases, the calibration logic may be configured to select between the plurality of frequency bands by changing a capacitance value of the digital capacitor bank.

The configuration logic may be configured to change the capacitance value, electronically, by setting a digital capacitor selector value configured to enable or disable capacitors of the digital capacitor bank on an individual basis.

The one-point calibration phase may be performed followed by the multi-point calibration phase in response to a change in the target frequency.

The circuit may further comprise a phase-locked loop (PLL) including the multi-band VCO and configured to receive a reference signal with a reference frequency and may further include a divider circuit configured to divide down a frequency of the output signal by a divide value. The target frequency may be changed by changing the divide value, the reference frequency, or a combination thereof.

The circuit may further comprise a phase-locked loop (PLL) including the multi-band VCO, a loop filter, and a divider circuit. The divider circuit may be configured to divide down a frequency of the output signal to produce a divided output signal. The PLL may be configured to receive a reference signal. The circuit may further comprise a digital-to-analog converter (DAC) and a first switch configured to enable the DAC to drive the input control voltage in an event the calibration is active, a second switch configured to enable the loop filter to drive the input control voltage in an event the calibration is inactive, a first counter configured to receive the reference signal and produce a reference count value therefrom to the calibration logic, and a second counter configured to receive the divided output signal and produce a divided count value therefrom to the calibration logic.

In the one-point calibration phase, the input control voltage may be maintained at the single input control voltage value via the DAC and the calibration logic may be configured to set a given frequency band of the plurality of frequency bands and compare the divided count value to the reference count value, and converge on an initial frequency band by changing the given frequency band set according to a search criterion and comparing the divided count value to the reference count value for each change to the given frequency band set.

In the one-point calibration phase, the given frequency band may be set, initially, to a frequency band that is midway between a highest frequency band and a lowest frequency band in a range of frequency bands of the plurality of frequency bands.

The calibration logic may be further configured to change a digital capacitor selector value to change the given frequency band. The digital capacitor selector value may be chosen in accordance with the search criterion.

The multiple input control voltage values may be set via the DAC and may include a higher voltage value higher in voltage relative to the single input control voltage value employed in the one-point calibration phase and a lower voltage value lower in voltage relative to the single input control voltage value. In the multi-point calibration phase, the calibration logic may be configured to set a given frequency band of the plurality of frequency bands to an initial frequency band converged on in the one-point calibration phase, set the input control voltage value to the higher voltage value and, in response to the reference count value reaching a predetermined reference count, obtain a first divided count value, set the input control voltage value to the lower voltage value and, in response to the reference count value reaching the predetermined reference count, obtain a second divided count value, and compute a first average divided count value of the first divided count value and the second divided count value.

In the multi-point calibration phase, the calibration logic may be further configured to set the given frequency band to a lower frequency band, the lower frequency band consecutively lower in frequency relative to the initial frequency band, set the input control voltage value to the higher voltage value and, in response to the reference count value reaching the predetermined reference count, obtain a third divided count value, set the input control voltage value to the lower voltage value and, in response to the reference count value reaching the predetermined reference count, obtain a fourth divided count value, and compute a second average divided count value of the third divided count value and the fourth divided count value.

In the multi-point calibration phase, the calibration logic may be further configured to set the given frequency band to a higher frequency band, the higher frequency band consecutively higher in frequency relative to the initial frequency band, set the input control voltage value to the higher voltage value and, in response to the reference count value reaching the predetermined reference count, obtain a fifth divided count value, set the input control voltage value to the lower voltage value and, in response to the reference count value reaching the predetermined reference count, obtain a sixth divided count value, and compute a third average divided count value of the fifth divided count value and the sixth divided count value.

In the multi-point calibration phase, the calibration logic may be further configured to determine a closest average divided count value to the predetermined reference count from among the first, second, and third average divided count values, and select the optimal frequency band from among the initial frequency band converged on in the one-point calibration phase, the higher frequency band, and the lower frequency band, the optimal frequency band corresponding to the given frequency band employed to produce the closest average divided count value.

According to another example embodiment, a method for selecting a frequency band for a multi-band voltage controlled oscillator (VCO) having a plurality of frequency bands may comprise receiving an input control voltage at the multi-band VCO, producing an output signal with a target frequency from the multi-band VCO, and performing a calibration of the multi-band VCO to select an optimal frequency band from among the plurality of frequency bands. The calibration may include a one-point calibration phase employing a single input control voltage value for the input control voltage followed by a multi-point calibration phase employing multiple input control voltage values for the input control voltage. The optimal frequency band may be selected as optimal for enabling the multi-band VCO to produce the output signal with the target frequency.

The multi-point calibration phase may be a two-point calibration phase and the method may further comprise employing two input control voltage values for the input control voltage. The two input control voltage values may include a higher voltage value and a lower voltage value. The higher voltage value may be higher in voltage relative to the single input control voltage value employed in the one-point calibration phase and the lower voltage value may be lower in voltage relative to the single input control voltage value.

The method may further comprise, in the one-point calibration phase, converging on an initial frequency band of the plurality of frequency bands with the input control voltage maintained at the single input control voltage value and, in the multi-point calibration phase, selecting the optimal frequency band from among the initial frequency band converged on in the one-point calibration phase, a higher neighboring frequency band, and a lower neighboring frequency band. The higher neighboring frequency band may be higher in frequency relative to the initial frequency band and the lower neighboring frequency band may be lower in frequency relative to the initial frequency band.

The method may further comprise, in the one-point calibration phase, converging on the initial frequency band using a search criterion.

The search criterion may be a binary search and the method may further comprise, in the one-point calibration phase, beginning with a given frequency band of the plurality of frequency bands prior to the binary search, the given frequency band located midway between a highest frequency band and lowest frequency band in a range of frequency bands of the plurality of frequency bands.

The method may further comprise, in the multi-point calibration phase, setting a given frequency band of the plurality of frequency bands to each of the initial frequency band converged on in the one-point calibration phase, the lower neighboring frequency band, and the higher neighboring frequency band in combination with setting the input control voltage to the higher voltage value and setting the input control voltage to the lower voltage value.

The method may further comprise, in the one-point and the multi-point calibration phases, selecting between the plurality of frequency bands by changing a capacitance value of digital capacitor bank acting as a variable capacitor of the multi-band VCO.

The method may further comprise changing the capacitance value, electronically, by setting a digital capacitor selector value configured to enable or disable capacitors of the digital capacitor bank on an individual basis.

The method may further comprise performing the one-point calibration phase followed by the multi-point calibration phase in response to a change in the target frequency.

The method may further comprise receiving a reference signal with a reference frequency, dividing down a frequency of the output signal by a divide value, and changing the target frequency by changing the divide value, the reference frequency, or a combination thereof.

The method may further comprise dividing down a frequency of the output signal to produce a divided output signal, receiving a reference signal, configuring a first switch to couple a digital-to-analog converter (DAC) to enable the DAC to drive the input control voltage in an event the calibration is active, configuring a second switch to enable a loop filter to drive the input control voltage in an event the calibration is inactive, receiving the reference signal at a first counter and producing a reference count value therefrom, and receiving the divided output signal at a second counter and producing a divided count value therefrom.

The method may further comprise, in the one-point calibration phase, maintaining the input control voltage at the single input control voltage value via the DAC, setting a given frequency band of the plurality of frequency bands and, in response to the reference count value reaching a predetermined reference count, comparing the divided count value to the reference count value, and converging on an initial frequency band by changing the given frequency band set, iteratively, according to a search criterion and comparing the divided count value to the reference count value, iteratively, in response to the reference count value reaching a predetermined reference count, for each change to the given frequency band set.

The method may further comprise, in the one-point calibration phase, setting the given frequency band, initially, to a frequency band that is midway between a highest frequency band and a lowest frequency band in a range of frequency bands of the plurality of frequency bands.

The method may further comprise changing a digital capacitor selector value to change the given frequency band and choosing the digital capacitor selector value in accordance with the search criterion.

The method may further comprise setting the multiple input control voltage values via the DAC. The multiple input control voltage values may include a higher voltage value higher in voltage relative to the single input control voltage value employed in the one-point calibration phase and a lower voltage value lower in voltage relative to the single input control voltage value. In the multi-point calibration phase, performing the calibration may include setting a given frequency band of the plurality of frequency bands to an initial frequency band converged on in the one-point calibration phase, setting the input control voltage value to the higher voltage value and, in response to the reference count value reaching a predetermined reference count, obtain a first divided count value, setting the input control voltage value to the lower voltage value and, in response to the reference count value reaching the predetermined reference count, obtain a second divided count value, and computing a first average divided count value of the first divided count value and the second divided count value.

In the multi-point calibration phase, performing the calibration may include setting the given frequency band to a lower frequency band, the lower frequency band consecutively lower in frequency relative to the initial frequency band, setting the input control voltage value to the higher voltage value and, in response to the reference count value reaching the predetermined reference count, obtaining a third divided count value, setting the input control voltage value to the lower voltage value and, in response to the reference count value reaching the predetermined reference count, obtaining a fourth divided count value, and computing a second average divided count value of the third divided count value and the fourth divided count value.

In the multi-point calibration phase, performing the calibration may include setting the given frequency band to a higher frequency band, the higher frequency band consecutively higher in frequency relative to the initial frequency band, setting the input control voltage value to the higher voltage value and, in response to the reference count value reaching the predetermined reference count, obtaining a fifth divided count value, setting the input control voltage value to the lower voltage value and, in response to the reference count value reaching the predetermined reference count, obtaining a sixth divided count value, and computing a third average divided count value of the fifth divided count value and the sixth divided count value.

In the multi-point calibration phase, performing the calibration may include determining a closest average divided count value to the predetermined reference count from among the first, second, and third average divided count values, and selecting the optimal frequency band from among the initial frequency band converged on in the one-point calibration phase, the higher frequency band, and the lower frequency band, the optimal frequency band corresponding to the given frequency band employed to produce the closest average divided count value.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 8A is a graph of an example embodiment of a calibration enable signal over time.

FIG. 8B is a graph of an example embodiment of a reference count value and a divided count value over time.

FIG. 8C is a graph of an example embodiment of an input control voltage over time.

FIG. 8D is a graph of an example embodiment of a digital capacitor selector value over time.

FIG. 8E is a graph of an example embodiment of a reference frequency of a reference signal over time relative to a divided frequency of a divided output signal.

DETAILED DESCRIPTION

A description of example embodiments follows.

An example embodiment selects an optimal frequency band of a plurality of frequency bands of multi-band voltage-controlled oscillator (VCO) to achieve a particular output frequency from the multi-band VCO. The optimal frequency band is selected, automatically, based on performing a one-point calibration phase followed by a multi-point calibration phase. The multi-point calibration phase may be a two-point calibration phase. The one-point calibration phase may produce a first frequency band selection and the multi-point calibration phase may select the optimal frequency band from a group of frequency bands including the first frequency band selection, a second frequency band higher in frequency relative to the first frequency band selection, and a third frequency band lower in frequency relative to the first frequency band selection.

Figure 1:
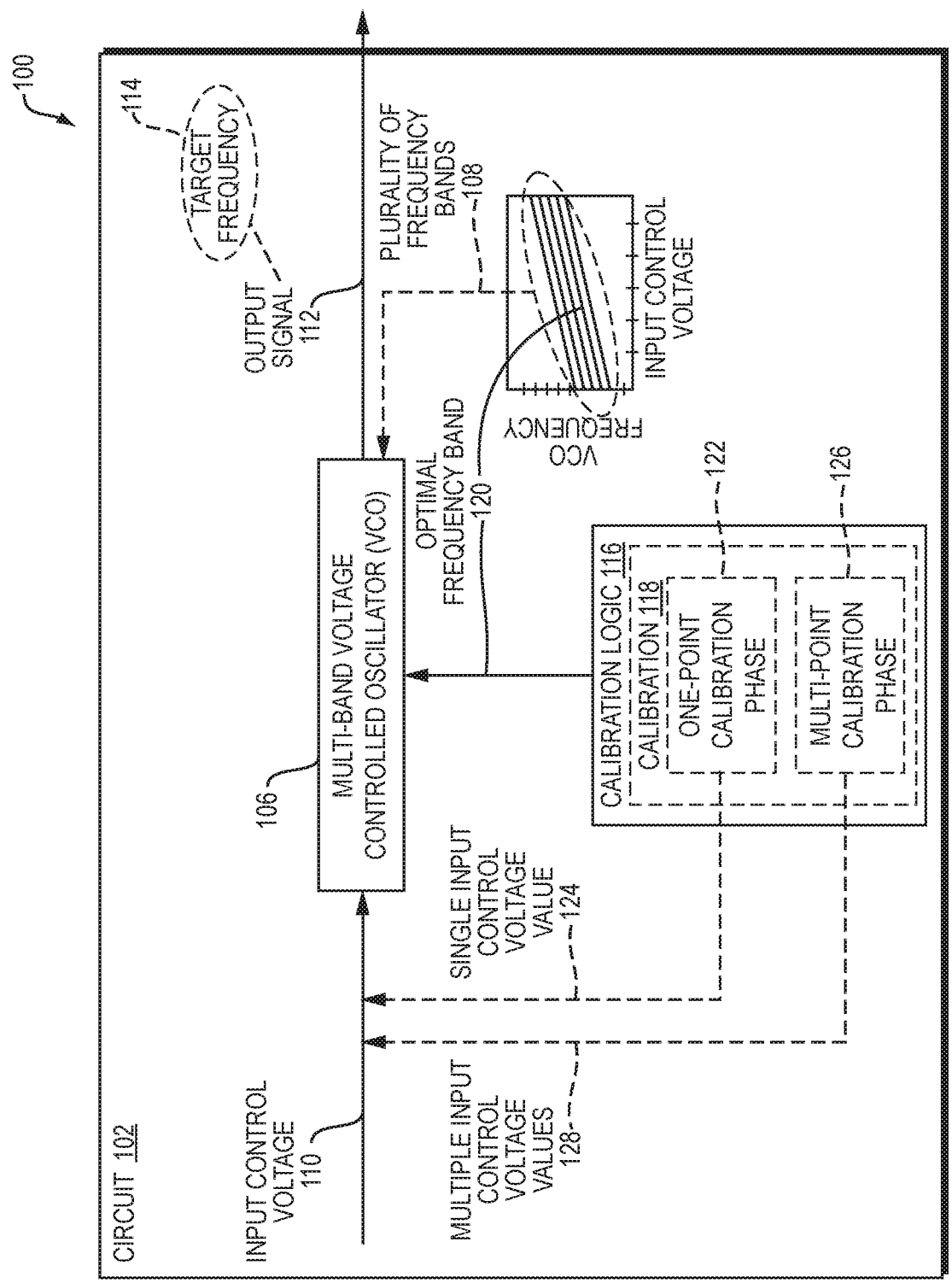
FIG. 1 is a block diagram of an example embodiment of a circuit that comprises a multi-band voltage controlled oscillator (VCO) having a plurality of frequency bands.

FIG. 1 is a block diagram 100 of an example embodiment of a circuit 102 that comprises a multi-band voltage controlled oscillator (VCO) 106 having a plurality of frequency bands 108. The multi-band VCO 106 may have a significant amount of bands to support wide frequency coverage. The multi-band VCO 106 is configured to receive an input control voltage (also referred to interchangeably herein as Vctrl) 110 and produce an output signal 112 with a target frequency 114. The circuit 102 comprises calibration logic 116 configured to perform a calibration 118 of the multi-band VCO 106 to select an optimal frequency band 120 from among the plurality of frequency bands 108. The calibration 118 includes a one-point calibration phase 122 employing a single input control voltage value 124 for the input control voltage 110 followed by a multi-point calibration phase 126 employing multiple input control voltage values 128 for the input control voltage 110. The optimal frequency band 120 may be selected as optimal for enabling the multi-band VCO 106 to produce the output signal 112 with the target frequency 114.

It should be understood that the optimal frequency band 120 disclosed in FIG. 1 is for illustrative purposes and that the optimal frequency band 120 may be any suitable frequency band from among the plurality of frequency bands 108 that is deemed optimal based on the calibration 118.

Figure 2:
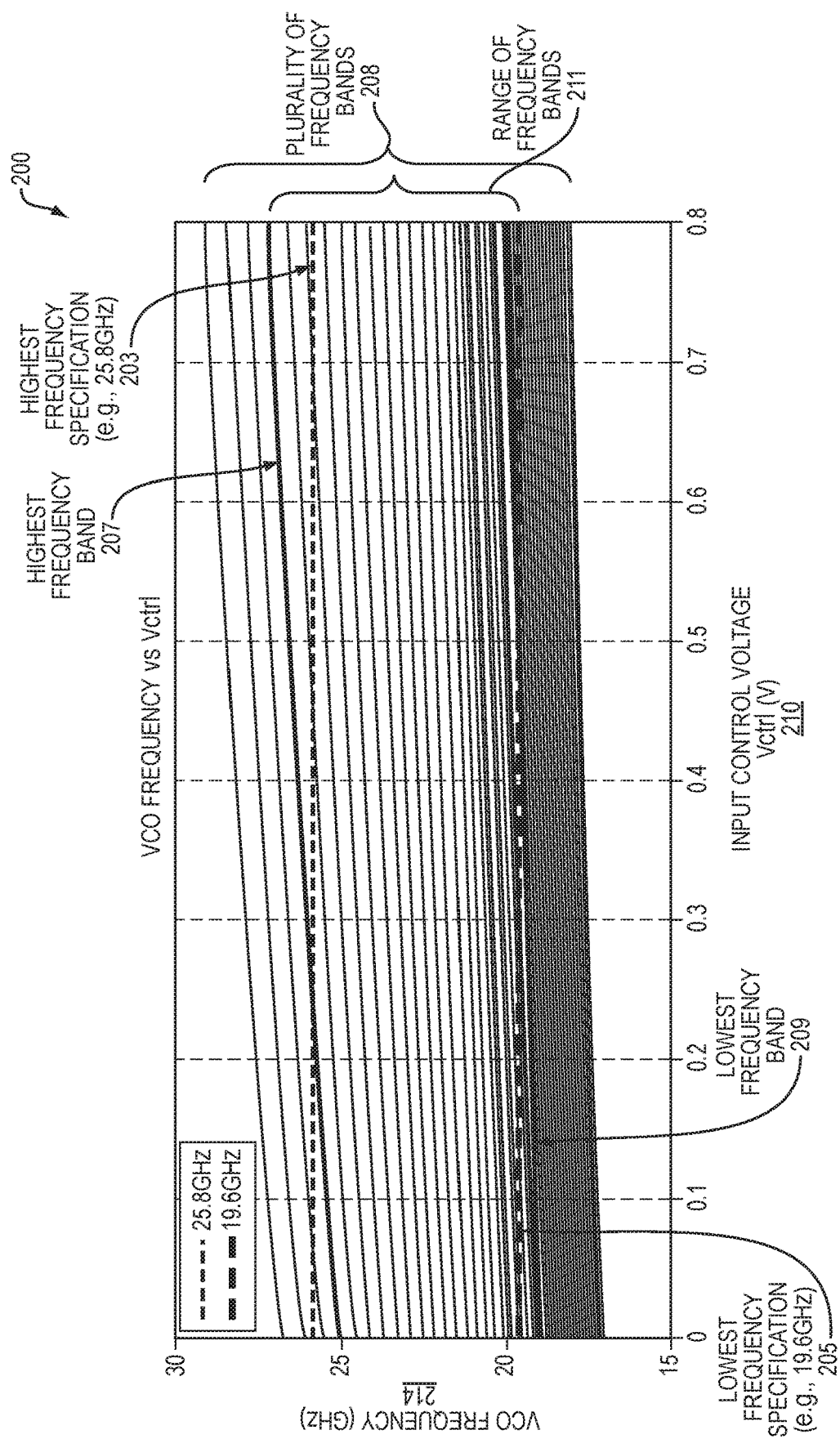
FIG. 2 is a graph of an example embodiment of a plurality of frequency bands of a multi-band VCO.

FIG. 2 is a graph 200 of an example embodiment of a plurality of frequency bands 208 of a multi-band VCO, such as the multi-band VCO 106 of FIG. 1, disclosed above. Different applications that employ the multi-band VCO 106 may have different frequency requirements. As such, it may be useful for the multi-band VCO 106 to support generation of an output signal with a range of frequencies. For example, the circuit 102 may be employed in a serializer de-serializer (SerDes). Different SerDes applications may have different requirements for frequency based on the SerDes standard being employed. For example, different SerDes standards may have different frequency requirements, such as 19.6 GHz, 20.6 GHz, 24 GHz, or 25.8 GHz. As such, it may be useful for the multi-band VCO 106 to operate over a given frequency range, such as a given frequency range including a highest frequency specification 203, such as 25.8 GHz, and a lowest frequency specification 205, such as 19.6 GHz, or over any other suitable frequency range.

The graph 200 shows that for the given frequency range, such as the given frequency range from 19.6 GHz to 25.8 GHz, a single frequency band is not sufficient to cover the given frequency range in its entirety. As such, multiple frequency bands may be employed to cover the given frequency range. A range of frequency bands 111 of the plurality of frequency bands 208 may be chosen to support the given frequency range. The range of frequency bands may include a highest frequency band 207, a lowest frequency band 209, and frequency bands therebetween to cover the given frequency range in its entirety. The highest frequency band 207 and the lowest frequency band 209 may be chosen so as to provide a safety margin of one or more extra bands above and below bands associated with the highest frequency specification 203 and the lowest frequency specification 205, respectively, to accommodate for fabrication variations.

Turning back to FIG. 1, in order to configure the multi-band VCO 106 to oscillate at the target frequency 114, an example embodiment may select the optimal frequency band 120 from the plurality of frequency bands 108, or more specifically, an example embodiment may select the optimal frequency band 120 from a range of frequency bands, such as the range of frequency bands 211 of the plurality of frequency bands 208, as disclosed above with reference to FIG. 2.

Figure 3:
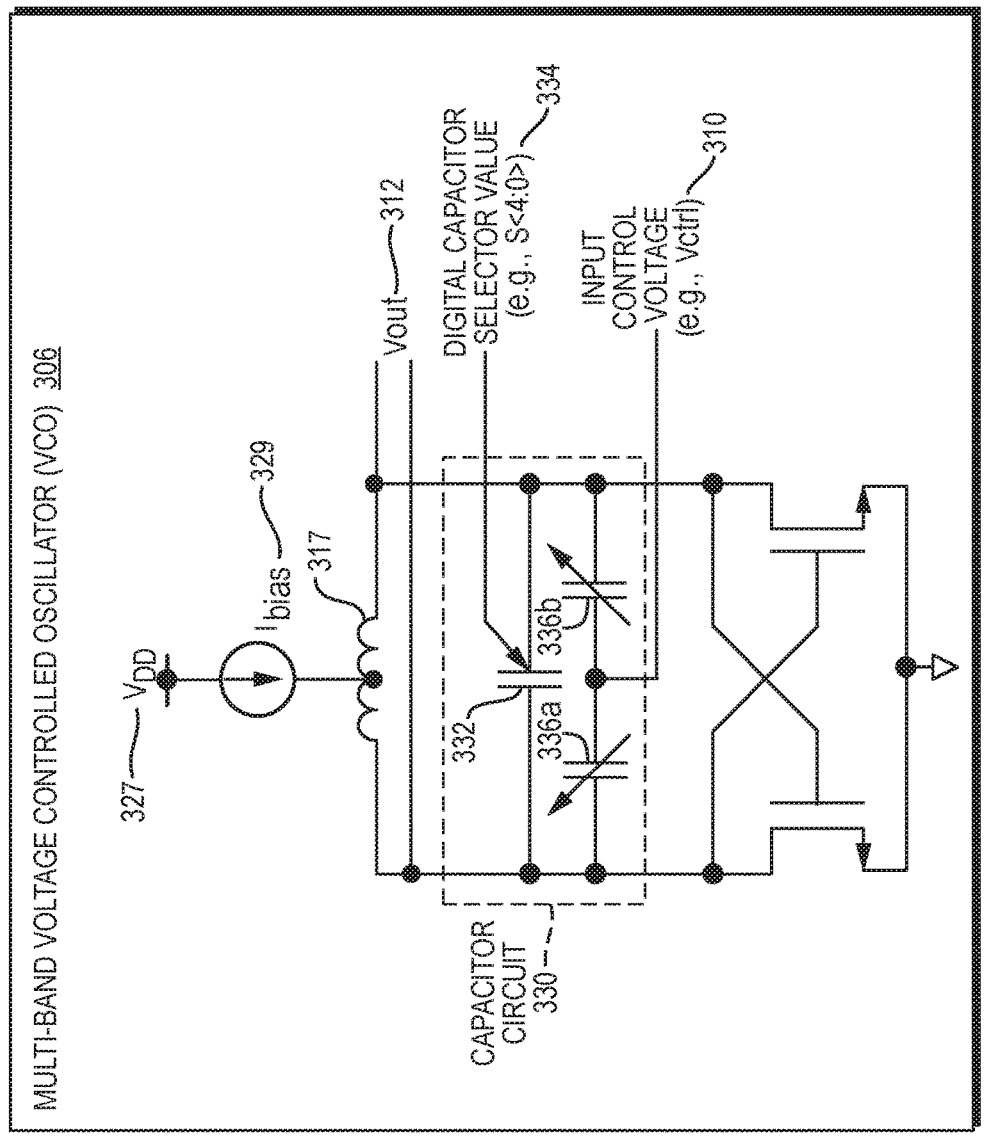
FIG. 3 is a circuit diagram of an example embodiment of a multi-band VCO.

FIG. 3 is a circuit diagram 300 of an example embodiment of a multi-band VCO 306. It should be understood that a value for a power supply VDD 327 may be any suitable value, such as a power supply voltage value in a range from 500 mV to 500 mV, or from 500 mV to 2V, or any other power supply voltage value suitable to an integrated circuit employing the multi-band VCO 306. Further, the bias current $I_{bias}$ 329 may be any suitable value, such as from 0.1 mA to 100 mA, depending on the oscillation frequency and performance parameters, such as output noise and output swing.

The multi-band VCO 306 may be employed as the multi-band VCO 106 of FIG. 1, disclosed above. The multi-band VCO 306 includes an inductor 317 with an inductance L (not shown) and a capacitor circuit 330 with a capacitance C (not shown). An oscillation frequency f (not shown) of the output signal 312 of the multi-band VCO 306 may be determined by the inductance L and the capacitance C as follows:

$$f=1/\{2*\pi*\sqrt{(LC)}\}.$$

The output signal 312 may be taken across the inductor 317 for a differential design. However, it should be understood that the output signal 312 may be single-ended.

In the example embodiment of the multi-band VCO 306 of FIG. 3, the capacitance C of the capacitor circuit 330 has two capacitor components including a digitally controlled capacitor component and an analog controlled capacitor component. The digitally controlled capacitor component may be a digital capacitor bank 332 that may be an array of capacitors (not shown) for which a corresponding binary state (e.g., on/off, enable/disable, active/inactive, etc.) may be controlled via a digital capacitor selector value 334 that may applied to the digital capacitor bank 332 via a digital control signal bus (not shown). The digital capacitor selector value 334 may have a number of bits corresponding to a number of capacitors composing the digital capacitor bank 332, each bit of the number of bits controlling whether a corresponding capacitor is enabled or disabled.

The digital capacitor bank 332 may be composed of any suitable group of capacitors of any suitable number arranged in series, in parallel, or a combination thereof. A setting for the digital capacitor selector value 334 may select a given frequency band (not shown) of the plurality of frequency bands (not shown) of the multi-band VCO 306, such as the plurality of frequency bands 108 or the plurality of frequency bands 208 of FIG. 1 and FIG. 2, respectively, as disclosed above.

According to an example embodiment, the digital capacitor bank 332 may be composed of five digital capacitors arranged in parallel with the inductor 317, with respective values of 16 C, 8 C, 4 C, 2 C, 1 C, wherein C represents a common amount of capacitance. With the digital capacitor selector value 334 configured as a 5 bit control signal (e.g., s<4:0>), any multiple of C may be selected from 0 C to 31 C, enabling the multi-band VCO to select a frequency band of a plurality of frequency bands, such as a frequency band of the 32 frequency bands in the example embodiment.

The analog controlled capacitor component may include one or more analog tuning varactors, such as the first analog tuning varactor 336a and the second analog tuning varactor 336b. A variable capacitance (not shown) of the first analog tuning varactor 336a and the second analog tuning varactor 336b may be controlled by an analog control signal, such as the input control voltage 310, referred to interchangeably herein as Vctrl.

Turning back to FIG. 2, the plurality of frequency bands 208 includes 32 frequency bands. The digital capacitor selector value 334 of FIG. 3, disclosed above, may be sized based on a number of bits that enable selection of each frequency band of the plurality of frequency bands 208 on an individual basis. For example, to select the 32 frequency bands of the plurality of frequency bands 208 on an individual basis, a 5-bit signal bus denoted, for example, by s<4:0>, may be employed to set the digital capacitor selector value 334. The graph 200 is a plot of the VCO frequency 214 versus the input control voltage 210 (e.g., Vctrl(V)). The 32 frequency bands included in the plurality of frequency bands 208 may be chosen by the 5-bit s<4:0> control that may be employed as the digital capacitor selector value 334. On any given frequency band of the plurality of frequency bands 208 selected via the digital capacitor selector value 334, frequency may be controlled by the input control voltage 210. Thus, using the digital capacitor selector value 334 (e.g., s<4:0>) and the input control voltage 310 (e.g., Vctrl), the multi-band VCO 306 may be tuned to a target frequency for an application, such as a phase-locked loop (PLL) application. For example, the multi-band VCO 306 may be tuned to a target frequency for a PLL employing the multi-band VCO 306, such as the PLL 404 of FIG. 4, disclosed further below.

As disclosed above, the multi-band VCO 306 includes a digital capacitor bank 332 that may act as a variable capacitor. In the one-point and the multi-point calibration phases, the calibration logic 116 may be configured to select between the plurality of frequency bands 108 by changing a capacitance value (not shown) of the digital capacitor bank 332. The configuration logic 116 may be configured to change the capacitance value, electronically, by setting the digital capacitor selector value 334 configured to enable or disable capacitors (not shown) of the digital capacitance bank 332 on an individual basis.

Figure 4:
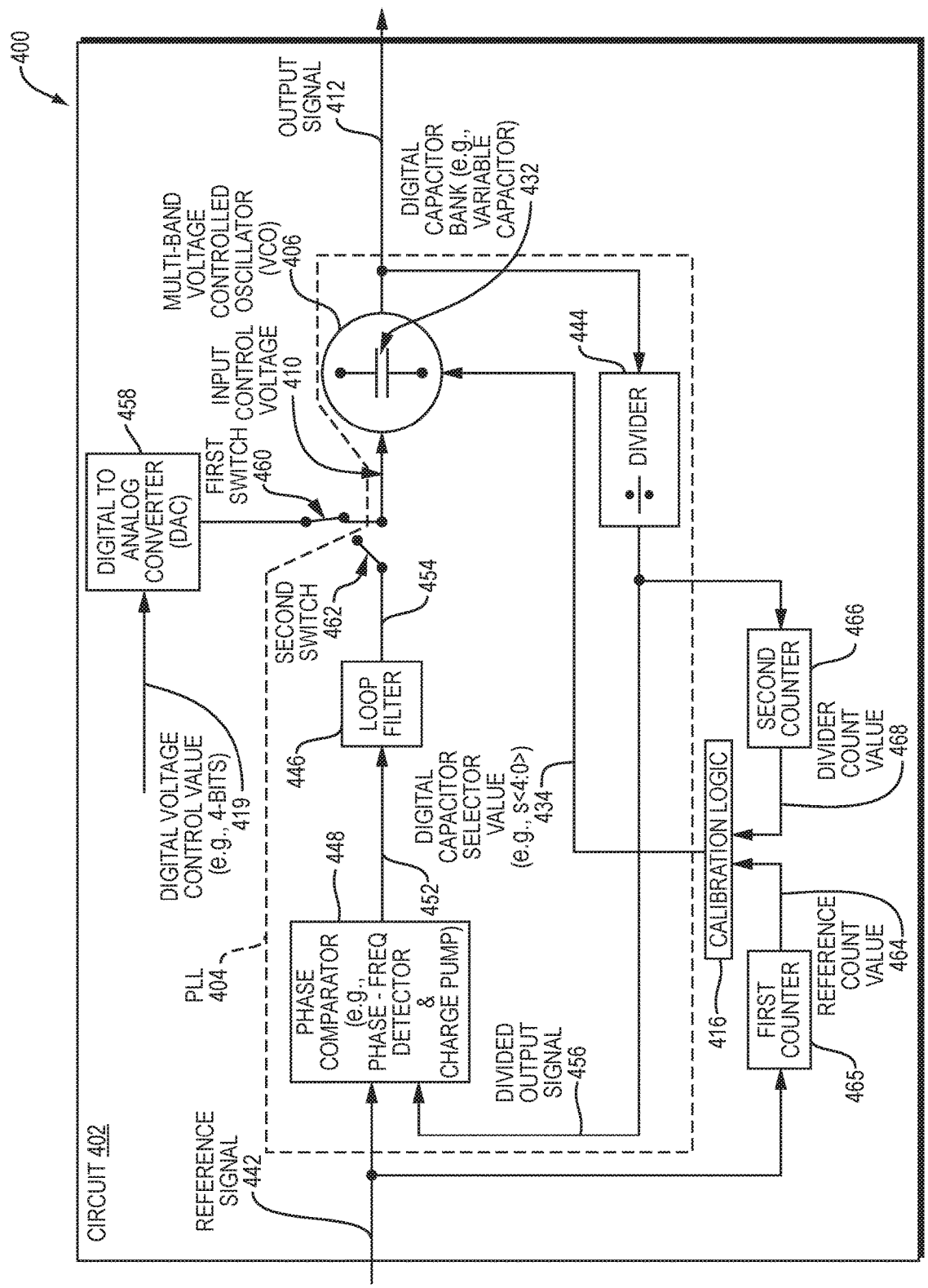
FIG. 4 is a circuit diagram of an example embodiment of a circuit that comprises a PLL that includes a multi-band VCO having a plurality of frequency bands.
Figure 5A:
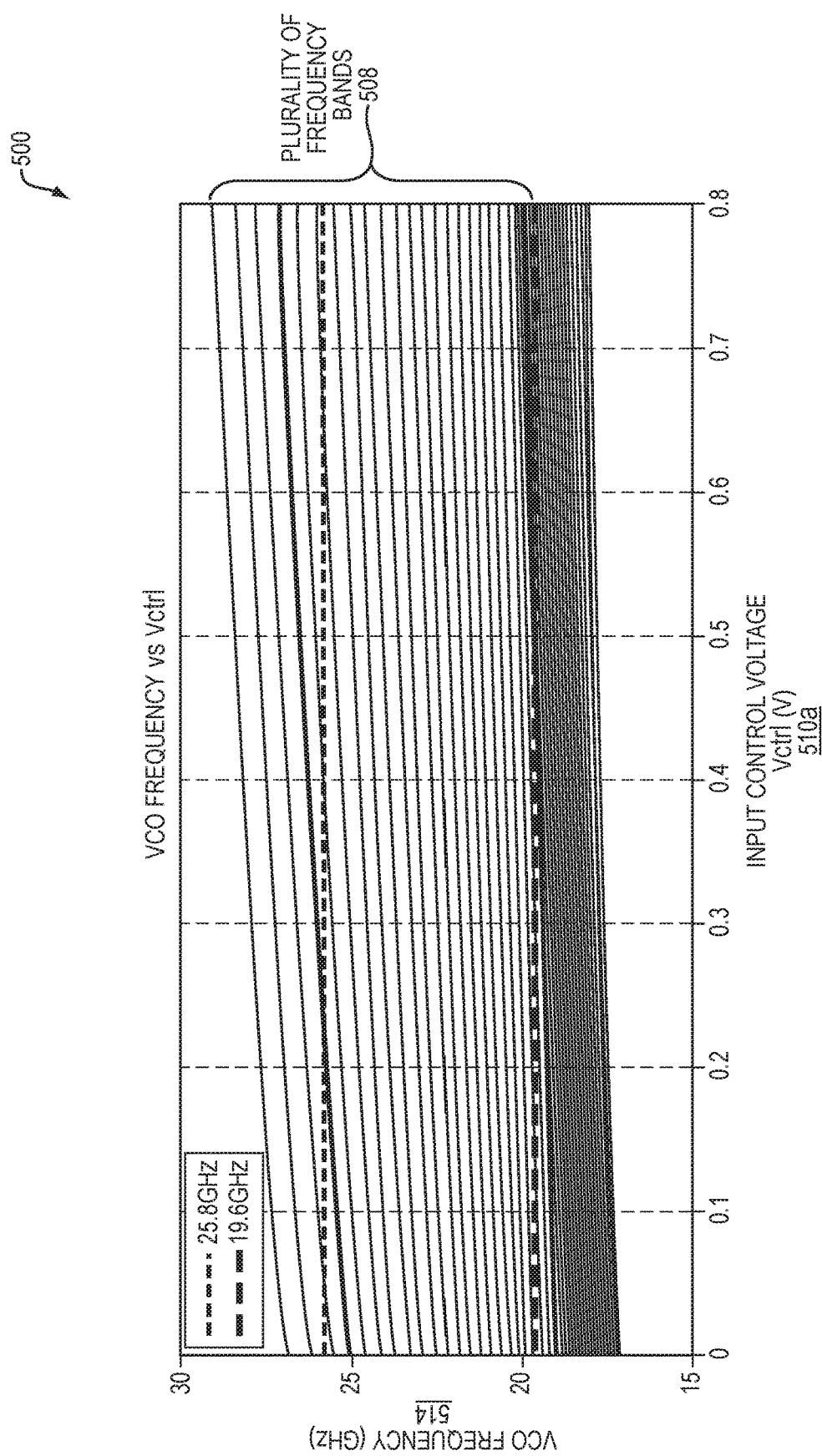
FIG. 5A is a graph of another example embodiment of a plurality of frequency bands of a multi-band VCO.

FIG. 4 is a circuit diagram 400 of an example embodiment of a circuit 402 that comprises a PLL 404 that includes a multi-band VCO 406 having a plurality of frequency bands (not shown), such as the plurality of frequency bands 508 of FIG. 5A.

FIG. 5A is a graph 500 of another example embodiment of a plurality of frequency bands 508 of a multi-band VCO. The graph 500 is a plot of the VCO frequency 514 versus the input control voltage 510a (e.g., Vctrl(V)).

Turning back to FIG. 4, the multi-band VCO 406 may be configured to receive an input control voltage 410 and produce an output signal 412 with a target frequency (not shown), such as the target frequency 114 of FIG. 1, disclosed above. The circuit 400 comprises calibration logic 416 configured to perform a calibration of the multi-band VCO 406 to select an optimal frequency band (not shown) of the plurality of frequency bands 508 of FIG. 5A. The calibration may include a one-point calibration phase (not shown), such as the one-point calibration phase 122 of FIG. 1 that may employ the single input control voltage value 124 for the input control voltage 410, followed by the multi-point calibration phase 126 that may employing the multiple input control voltage values 128 for the input control voltage 410. The optimal frequency band 120 may be selected as optimal for enabling the multi-band VCO 406 to produce the output signal 412 with the target frequency 114.

The PLL 404 further includes a divider circuit 444 (also referred to interchangeably herein as a feedback divider) that is configured to divide down a frequency the output signal 412 to produce a divided output signal 448, as well as a phase comparator 448 and a loop filter 446. The loop filter 446 may be any suitable type of loop filter, such as an integrating loop filter, and the phase comparator 448 may be a combination of phase/frequency detector and charge pump. A reset signal (not shown) may be employed to reset the PLL 404.

The PLL 404 may receive a reference signal 442 and compare it via the phase comparator 448 to the divided output signal 456 that has a divided down frequency of the output signal 412 of the multi-band VCO 406. An error signal 452 at the output of the phase comparator 448 is filtered by the loop filter 446 to produce a filtered output 454 that may be used as the input control voltage 410 to the multi-band VCO 406 in an event the second switch 462, disclosed further below, is closed.

The PLL 404 may be configured to receive the reference signal 442 with a reference frequency (not shown) and the divider circuit 444 may be configured to divide down a frequency of the output signal 412 by a divide value (not shown). The target frequency of the output signal 412 may be changed by changing the divide value, the reference frequency, or a combination thereof.

Figure 5B:
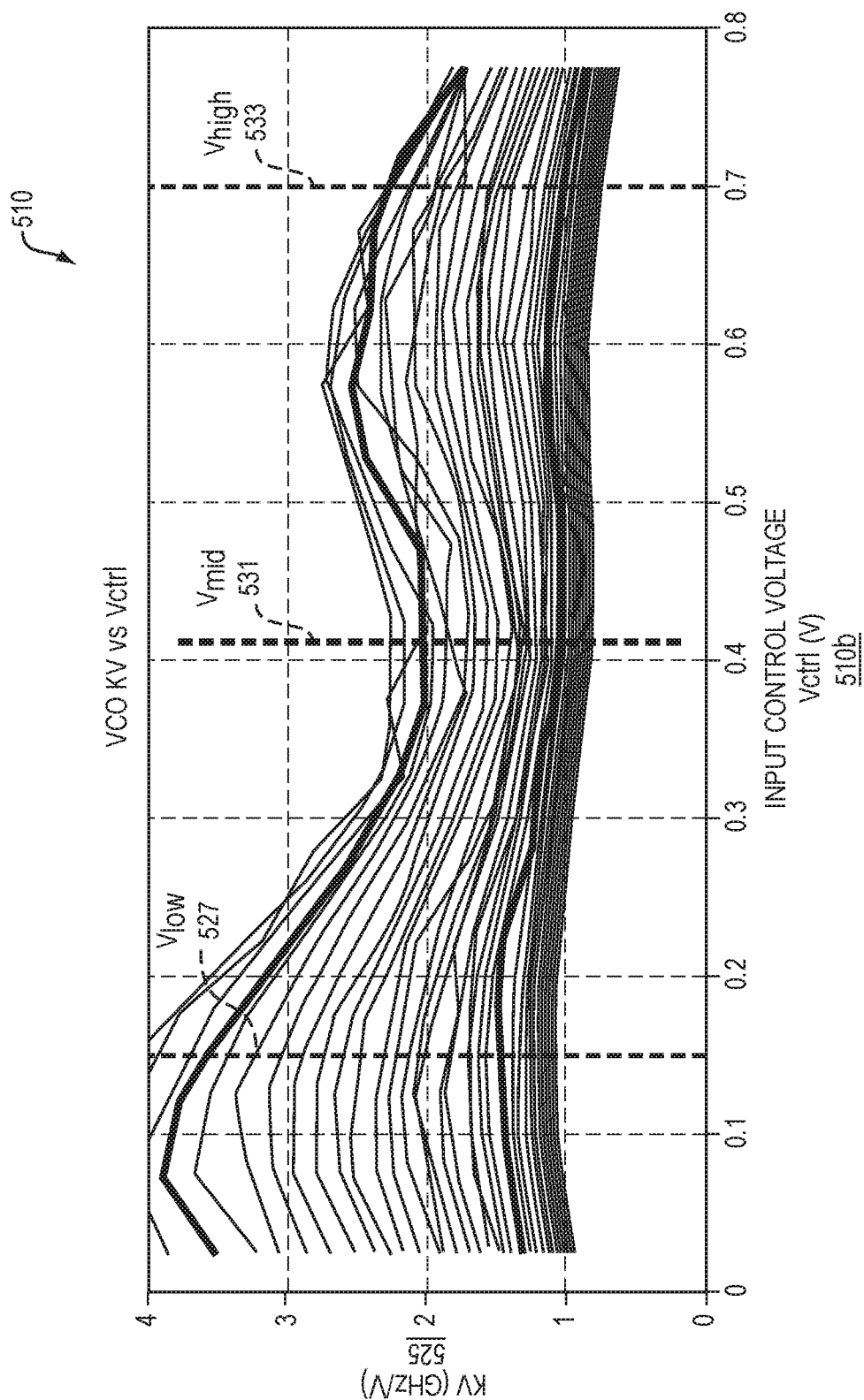
FIG. 5B is a graph of an example embodiment of a voltage-to-frequency gain of a multi-band VCO that results from a given change in the input control voltage.

The circuit 402 further comprises a digital-to-analog converter (DAC) 458 and a first switch 460 configured to enable the DAC 458 to drive the input control voltage 410 in an event the calibration is active. A digital control voltage value 419 may be input to the DAC 458 to generate the input control voltage 410 in an event the first switch 460 is closed to enable the DAC 458 to drive the input control voltage 410. FIG. 5B, disclosed below, discloses a voltage-to-frequency gain 525 for each of the plurality of frequency bands 508 of FIG. 5A for different settings of the digital control voltage value 419.

FIG. 5B is a graph 510 of an example embodiment of a voltage-to-frequency gain 525 (i.e., KV) versus the input control voltage 510b (e.g., Vctrl(V)) for the plurality of frequency bands 508 of FIG. 5A, disclosed above. The graph 510 indicates the voltage-to-frequency gain 525 for each of the plurality of frequency bands 508 for different settings of the digital control voltage value 419 input to the DAC 458, namely $V_{low}$ 527, $V_{mid}$ 531 and $V_{high}$ 533.

Turning back to FIG. 4, the second switch 462 may be configured to enable the loop filter 446 to drive the input control voltage 410 in an event the calibration is inactive. The circuit further comprises a first counter 465 configured to receive the reference signal 442 and produce a reference count value 464 therefrom to the calibration logic 416, and a second counter 466 configured to receive the divided output signal 456 and produce a divided count value 468 therefrom to the calibration logic 416.

In the one-point calibration phase, such as the one-point calibration phase 122 of FIG. 1, disclosed above, or the one-point calibration phase 622 of FIG. 6, disclosed further below, the input control voltage 410 may be maintained at the single input control voltage value 124 or the single input control voltage 624 via the DAC 458. The calibration logic 416 may be configured to set a given frequency band (not shown) of the plurality of frequency bands 508 of FIG. 5A and compare the divided count value 468 to the reference count value 464 in response to the reference count value 464 reaching a predetermined reference count. In the one-point calibration phase, the given frequency band may be set, initially, to a frequency band that is midway between a highest frequency band and a lowest frequency band in a range of frequency bands of the plurality of frequency bands 508.

As disclosed further below with reference to FIG. 6, in the one-point calibration phase 622, the calibration logic 416 may converge on an initial frequency band (not shown) by changing the given frequency band set, iteratively, according to a search criterion and comparing the divided count value 468 to the reference count value 464, iteratively, in response to the reference count value reaching a predetermined reference count, for each change to the given frequency band that is set. The calibration logic 416 may be further configured to change a digital capacitor selector value 434 to change the given frequency band in accordance with the search criterion.

The digital capacitor selector value 434 may have a number of bits corresponding to a number of capacitors composing a digital capacitor bank 432 serving as a variable capacitor, each bit of the number of bits controlling whether a corresponding capacitor of the digital capacitor bank 432 is enabled or disabled, as disclosed above with reference to the digital capacitor bank 332 of FIG. 3.

Turning back to FIG. 1, the multi-point calibration phase 126 may be a two-point calibration phase that employs two input control voltage values for the input control voltage 110. For example, in the multi-point calibration phase 126, the multiple input control voltages 128 may include two input control voltage values, such as disclosed below with reference to FIG. 6.

Figure 6:
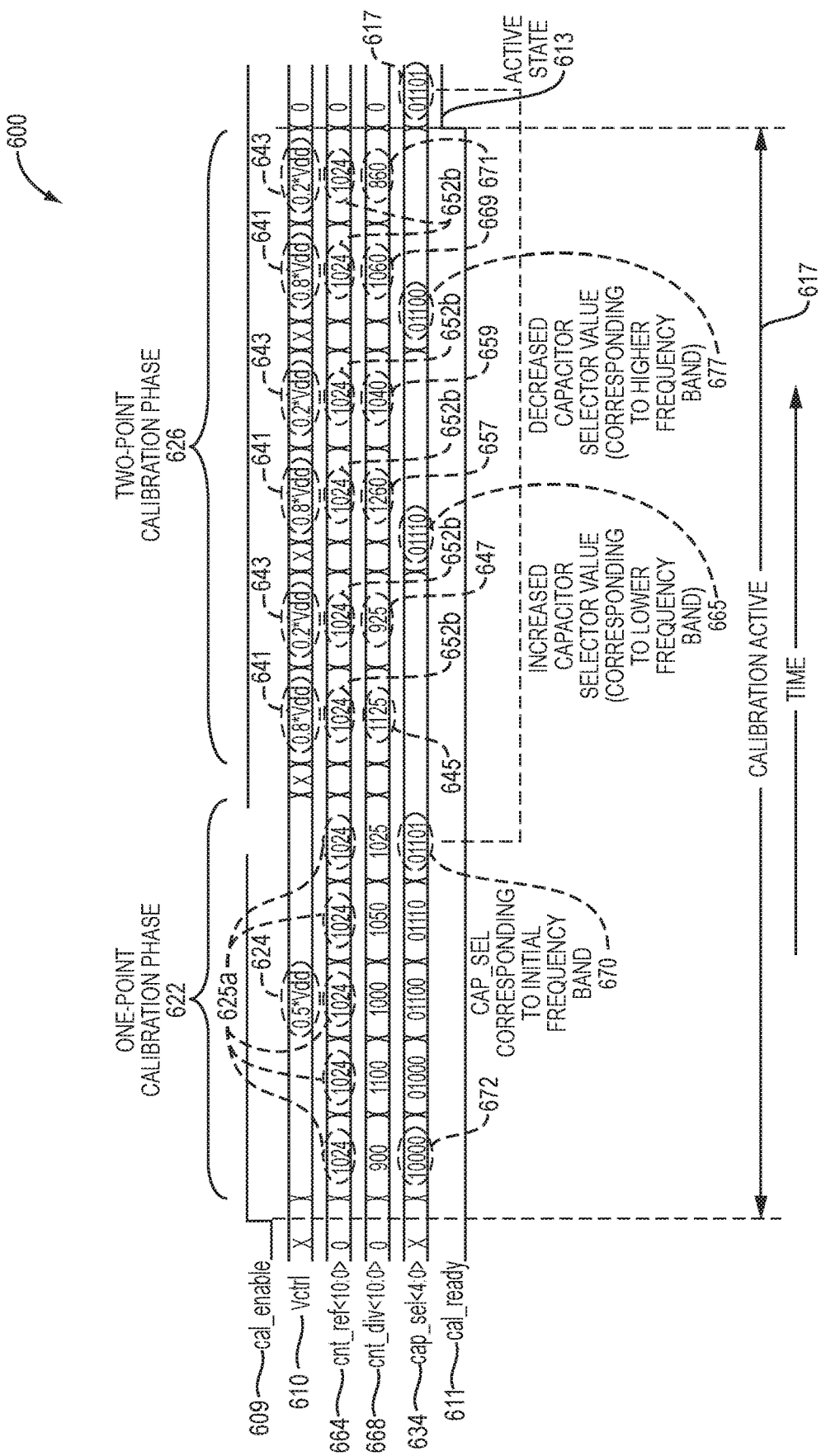
FIG. 6 is a timing diagram of an example embodiment of a one-point calibration phase followed by a two-point calibration phase.

FIG. 6 is a timing diagram 600 of an example embodiment of a one-point calibration phase 622 followed by a multi-point calibration phase, that is, a two-point calibration phase 626 in the example embodiment. The one-point calibration phase 622 may use a single data point, such as a single voltage value for the input control voltage, to make decisions in the calibration process whereas the two-point calibration phases 626 may use two data points, such as two values for the input control voltage, to make decisions in the calibration process. The timing diagram 600 is disclosed in further detail below, with reference to elements of FIGS. 1-4, disclosed above.

The timing diagram 600 includes a calibration ready signal 611 (i.e., cal_ready) and a calibration enable signal 609 (i.e., cal_enable). Calibration, such as the calibration 118 of FIG. 1, may begin in response to an assertion of the calibration enable signal 609. Calibration may be understood to be complete based on the calibration ready signal 611 transitioning to an active state 613.

The timing diagram 600 includes a digital capacitor selector value 634 that may be employed as the digital capacitor selector value 334 or the digital capacitor selector value 434 and used to select a frequency band for the multi-band VCO 306 or the multi-band VCO 406, of FIG. 3 and FIG. 4, respectively.

The timing diagram 600 includes an input control voltage 610 (i.e., Vctrl) that may be input to the multi-band VCO in an event that the calibration 118 is active 617. For example, in an event that the calibration 118 is active 617, the first switch 460 of the circuit 402 of FIG. 4 may be closed to enable the DAC 458 to drive the input control voltage 410 and the second switch 462 may be opened to disable the loop filter 446 from driving the input control voltage 410. The digital control voltage value 419 may be input to the DAC 458 to generate the input control voltage 410 with values shown for the input control voltage 610 for the one-point calibration phase 622 and the two-point calibration phase 626 as disclosed in FIG. 6.

The timing diagram 600 includes a reference count value 664 and a divided count value 668 that correspond to values output from the first counter 465 and the second counter 466 of FIG. 4, respectively. Further, the timing diagram includes the input control voltage 610 and the digital capacitor selector value 634 that correspond to values of the input control voltage 410 and the digital capacitor selector value 434 of FIG. 4, respectively. As disclosed with reference to FIG. 4, above, the first counter 465 is configured to receive the reference signal 442 and the second counter 466 is configured to receive the divided output signal 456. It should be understood that values for the input control voltage 610, digital capacitor selector value 634, reference count value 664, and divided count value 668 disclosed in FIG. 6 are for illustrative purposes and that any suitable values may be employed.

The calibration logic 416 may be utilized to find an optimal band in the multi-band VCO 406 to produce a target frequency, such as the target frequency 114 of FIG. 1, disclosed above. The calibration logic 416 may receive the reference count value 664 and compare the reference count value 664 to a predetermined reference count 625a that may represent an expected value of a number of VCO clock periods of the multi-band VCO 406 within a time frame for the target frequency 114. In the one-point calibration phase 622, the input control voltage 610 may be set to a predetermined value, namely the single input control voltage value 624, that may be static throughout the one-point calibration phase 622.

In the one-point calibration phase 622, the calibration logic 416 may select a starting frequency band by setting the digital capacitor selector value 634 and receive the reference count value 664 for comparison to the predetermined reference count 625a. In response to the reference count value 664 reaching the predetermined reference count 625a, the calibration logic 416 may be configured to compare the reference count value 664 to the divider count value 668 to determine how a generated frequency (not shown) of the output signal 412 compares to the target frequency 114. Based on a difference between the reference count value 664 to the divider count value 668, the calibration logic may select a next frequency band by setting a next value for the digital capacitor selector value 634 and, in response to the reference count value 664 reaching the predetermined reference count 625a, again compare the reference count value 664 to the divider count value 668 to determine how the generated frequency (not shown) of the output signal 412 compares to the target frequency 114.

The next frequency band may be selected based on any number of search criteria (e.g., linear, binary, complex). As a result of the one-point calibration phase, the calibration logic 416 may converge on an initial frequency band that corresponds to a converged digital capacitor selector value 670. It should be understood that the reference count value 664 and the divider count value 668 may never actually be equal. A decision may be made in the one-point calibration phase that the search has converged on the initial frequency band.

In the one-point calibration phase 622, the calibration logic, such as the calibration logic 116 of FIG. 1 or the calibration logic 416 of FIG. 4, disclosed above, may be configured to converge on an initial frequency band (not shown) of the plurality of frequency bands, such as the plurality of frequency bands 108 of FIG. 1 or the plurality of frequency bands 208 of FIG. 2, disclosed above. The calibration logic may be configured to converge on the initial frequency band with the input control voltage 610 maintained at the single input control voltage value 624. The calibration logic may be configured to converge on the initial frequency band by converging on the converged digital capacitor selector value 670 for the digital capacitor selector value 634, wherein the converged digital capacitor selector value 670 selects the initial frequency band.

As disclosed above, in the one-point calibration phase 622, the calibration logic may begin with a given frequency band of the plurality of frequency bands. For example, the calibration logic may set the digital capacitor selector value 634 to the given digital capacitor selector value 672 that selects the given frequency band. According to an example embodiment, the given frequency band may be located midway between a highest frequency band and lowest frequency band in a range of frequency bands of the plurality of frequency bands.

For example, in the example embodiment of FIG. 6, the given digital capacitor selector value 672 may be set to 10000b to select the given frequency band located midway between a highest frequency band and lowest frequency band of 32 available frequency bands each selected based on a unique value for the digital capacitor selector value 634 that may be a 5-bit digital control <4:0>. It should be understood that a number of the available frequency bands is not limited to 32 and that the number may be any suitable number. Further the number may be a total number covering a full range of the plurality of frequency bands or a reduced number of frequency bands within a reduced range relative to the full range, such as the range of frequency bands 211 of FIG. 2, disclosed above.

As disclosed in FIG. 6. the one-point calibration phase 622 may employ the single input control voltage value 624 for the input control voltage 410 and may be followed by a two-point calibration phase 626 that employs multiple input control voltage values for the input control voltage 410. The one-point calibration phase 622 may be performed followed by the two-point calibration phase 626 in response to a change in the target frequency. The multiple input control voltage values may be two input control voltage values that may include a higher voltage value 641 and a lower voltage value 643. The higher voltage value 641 may be higher in voltage relative to the single input control voltage value 624 employed in the one-point calibration phase 622 and the lower voltage value 643 may be lower in voltage relative to the single input control voltage value 624.

It should be understood that the values of 0.5 Vdd, 0.8 Vdd, and 0.2 Vdd, employed in the timing diagram 600 as the single input control voltage value 624, the higher voltage value 641, and the lower voltage value 643, respectively, are for illustrative purposes and that other suitable values may be employed. For example, the higher voltage value 641 and the lower voltage value 643 may be 0.7 Vdd and 0.3 Vdd, respectively. It should also be understood that values employed for the reference count value 664, divided count value 668, the digital capacitor selector value 634, and the predetermined reference count values 625*a* and 625*b* are also for illustrative purposes and the any suitable values may be employed.

In the two-point calibration phase 626, the calibration logic 416 may be configured to select the optimal frequency band from among the initial frequency band converged on in the one-point calibration phase, a higher neighboring frequency band, and a lower neighboring frequency band. The higher neighboring frequency band may be higher in frequency relative to the initial frequency band and the lower neighboring frequency band may be lower in frequency relative to the initial frequency band. According to an example embodiment, the lower neighboring frequency band and the higher neighboring frequency bands may be frequency bands adjacent to the initial frequency band.

In the two-point calibration phase 626, the calibration logic 416 may be configured to set a given frequency band of the plurality of frequency bands to each of the initial frequency band converged on in the one-point calibration phase, the lower neighboring frequency band, and the higher neighboring frequency band in combination with the input control voltage 610 set to the higher voltage value 641 and the input control voltage 610 set to the lower voltage value 643. The multiple input control voltage values may be set via the DAC 458.

In the two-point calibration phase 626, the calibration logic 416 may be configured to set a given frequency band of the plurality of frequency bands to the initial frequency band converged on in the one-point calibration phase 622, for example, by setting the digital capacitor selector value 634 to the converged digital capacitor selector value 670. The multiple input control voltage values may be set via the DAC 458 and may include the higher voltage value 641 higher in voltage relative to the single input control voltage value 624 employed in the one-point calibration phase 622 and the lower voltage value 643 lower in voltage relative to the single input control voltage value 624. In the two-point calibration phase 626, the calibration logic 416 may be configured to set a given frequency band of the plurality of frequency bands to an initial frequency band converged on in the one-point calibration phase 622, set the input control voltage value 610 to the higher voltage value 641 and, in response to the reference count value 664 reaching a predetermined reference count, such as the predetermined reference count 625*b*, obtain a first divided count value 645 of the divided count value 668, set the input control voltage value 610 to the lower voltage value 643 and, in response to the reference count value 664 reaching the predetermined reference count 625*b*, obtain a second divided count value 647 of the divided count value 668, and compute a first average divided count value (not shown) of the first divided count value 645 and the second divided count value 647.

In the two-point calibration phase 626, the calibration logic 416 may be further configured to set the given frequency band to a lower frequency band, the lower frequency band consecutively lower in frequency relative to the initial frequency band. For example, the calibration logic 416 may set the given frequency band to the higher frequency band by increasing the converged digital capacitor selector value 670 to an increased capacitor selector value 665. The calibration logic 416 may set the input control voltage value 610 to the higher voltage value 641 and, in response to the reference count value 664 reaching the predetermined reference count 625b, obtain a third divided count value 657 of the divided count value 668, set the input control voltage value 610 to the lower voltage value 643 and, in response to the reference count value 664 reaching the predetermined reference count 625b, obtain a fourth divided count value 659 of the divided count value 668, and compute a second average divided count value (not shown) of the third divided count value 657 and the fourth divided count value 659.

In the two-point calibration phase 626, the calibration logic 416 may be further configured to set the given frequency band to a higher frequency band, the higher frequency band consecutively higher in frequency relative to the initial frequency band. For example, the calibration logic 416 may set the given frequency band to the higher frequency band by decreasing the converged digital capacitor selector value 670 to a decreased capacitor selector value 677. The calibration logic 416 may set the input control voltage value 610 to the higher voltage value 641 and, in response to the reference count value 664 reaching the predetermined reference count 625b, obtain a fifth divided count value 669 of the divided count value 668, set the input control voltage value 610 to the lower voltage value 643 and, in response to the reference count value 664 reaching the predetermined reference count 625b, obtain a sixth divided count value 671 of the divided count value 668, and compute a third average divided count value (not shown) of the fifth divided count value 669 and the sixth divided count value 671.

In the two-point calibration phase, 626 the calibration logic 416 may be further configured to determine a closest average divided count value to the predetermined reference count 625b from among the first, second, and third average divided count values, and select the optimal frequency band from among the initial frequency band converged on in the one-point calibration phase, the higher frequency band, and the lower frequency band, the optimal frequency band corresponding to the given frequency band employed to produce the closest average divided count value.

For example, in the example embodiment of FIG. 6, the closest average divided count value to the predetermined reference count 625b from among the first, second, and third average divided count values is the first average divided count value. The first average divided count value is obtained with the digital capacitor selector value 634 set to the converged digital capacitor selector value 670 which selects the initial frequency band converged on in the one-point calibration phase 622. As such, the optimal frequency band selected in the example embodiment is the initial frequency band converged on in the one-point calibration phase 622 and the digital capacitor selector value 634 is set to the converged digital capacitor selector value 670 and the calibration ready signal 611 transitions to the active state 613 signifying that the optimal frequency band has been selected.

As disclosed above, in the two-point calibration phase 626, the calibration logic 416 may be further configured to select the optimal frequency band from among the initial frequency band converged on in the one-point calibration phase 622, the higher frequency band, and the lower frequency band. Following such a selection, the calibration ready signal 611 may transition to the active state 613 signifying that the optimal frequency band has been selected. Based on the calibration ready signal 611 transitioning to the active state 613, the first switch 460 may be opened and the second switch 462 may be closed, enabling the loop filter 446 to drive the input control voltage 410 and the calibration logic 416 may become inactive.

According to an example embodiment, the calibration ready signal 611 may transition to the active state 613 based on values of the divided count value 668 meeting certain criteria. For example, with the digital capacitor selector value 634 configured to select the optimal frequency band selected from among the initial frequency band converged on in the one-point calibration phase 622, the higher frequency band, and the lower frequency band, a first value, referred to interchangeably herein as N_div_point1, and a second value, referred to interchangeably herein as N_div_point2, of the divided count value 668 may be accumulated over a given time period for the reference count value 664 to reach the predetermined reference count value 625b with the input control voltage 410 set to the lower voltage value 643, and may be accumulated over a given time period for the reference count value 664 to reach the predetermined reference count value 625b with the input control voltage 410 set to the higher voltage value 641, respectively. The calibration may be determined to be completed and the calibration ready signal 611 transitioned to the active state 613 based on: N_div_point1<$N_{ref}$<N_div_point2, where $N_{ref}$ denotes the predetermined reference count value 625b.

In general, the two-point calibration phase 626 may take more time (roughly double an amount of time, but can be longer including settling times between each measurement) relative to the one-point calibration phase 622 and may use more resources, such as processing power and memory, and, in general, gives more accurate results relative to the one-point calibration phase 622.

According to an example embodiment, band calibration for a multi-band VCO may combine one-point calibration (referred to interchangeably herein as a course calibration phase) with a binary search in a one-point calibration phase to find a frequency band that is, coarsely, "good enough," and referred to interchangeably herein as an initial frequency band or a course frequency band. Following the one-point calibration phase, the example embodiment may utilize the course frequency band and its neighboring bands, such as a frequency band above and below the course frequency band, in a multi-point calibration phase that may be a two-point calibration phase. The multi-point calibration phase may be referred to interchangeably herein as a fine calibration phase. The fine calibration phase may select an optimal frequency band for the multi-band VCO from among the course frequency band and its neighboring bands.

With respect to performance the following is a summary with regard to the one-point calibration phase 622 and the two-point calibration phase 626 of FIG. 6, disclosed above, employing 32 bands and 5-bits for the digital capacitor selector value 634. It should be understood that 32 bands and 5-bits is for illustrative purposes and that any suitable number of bands and bits may be employed.

Example embodiment of a one-point calibration phase combined with a binary search is: 4 measurements×1-point calibration=4 unit time, followed by the example embodiment of a two-point calibration phase: 3 measurements×2-point calibration=6 unit time, and yields:

Total duration=10 unit time.    (A)

In comparison, a total duration of an example embodiment of a two-point calibration method that employs a linear search and achieves a similar accuracy relative to accuracy of an example embodiment of the one-point calibration phase followed by the two-point calibration phase is:

Total duration=32 measurements×2-point calibration=64 unit time.  (B)

Another comparison of an example embodiment that employs the binary search method with 2-point calibration throughout yields:

Total duration: 5 measurements×2-point calibration=10 unit time.  (C)

Figure 7A:
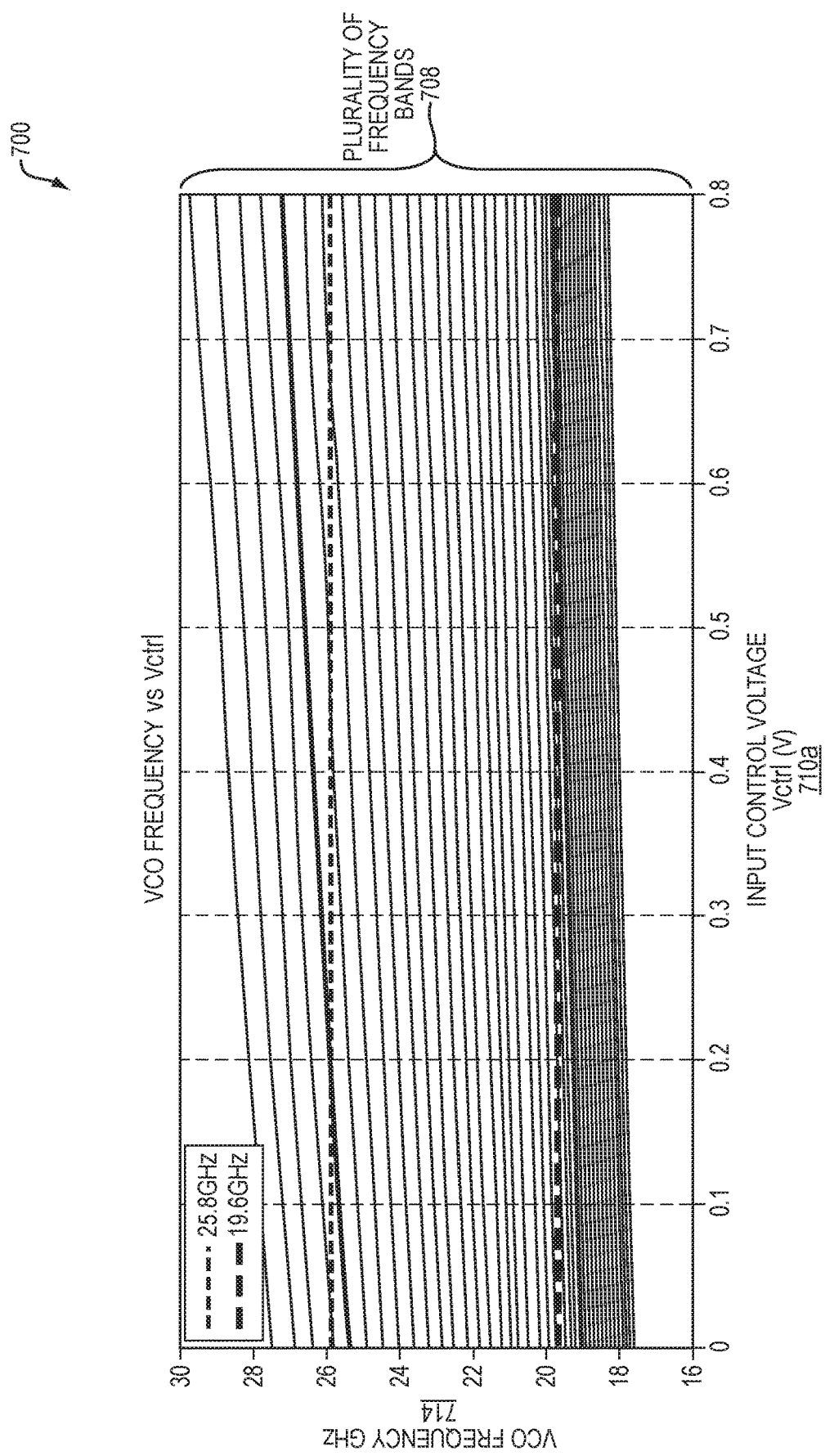
FIG. 7A is a graph of yet another example embodiment of a plurality of frequency bands of a multi-band VCO.

However, a greater advantage of the example embodiment of the one-point calibration phase followed by the two-point calibration phase comes when a number of bits is greater than 5-bits. For example if there are 8-bits (or 2^8=256 bands), then:

7×1+3×2=13 unit time.  (A):

256×2=512 unit time.  Comparison (B):

8×2=16 unit time.  Comparison (C):

FIG. 7A is a graph 700 of yet another example embodiment of a plurality of frequency bands 708 of a multi-band VCO. The graph 700 is a plot of the VCO frequency 714 versus the input control voltage 710 (e.g., Vctrl(V)).

Figure 7B:
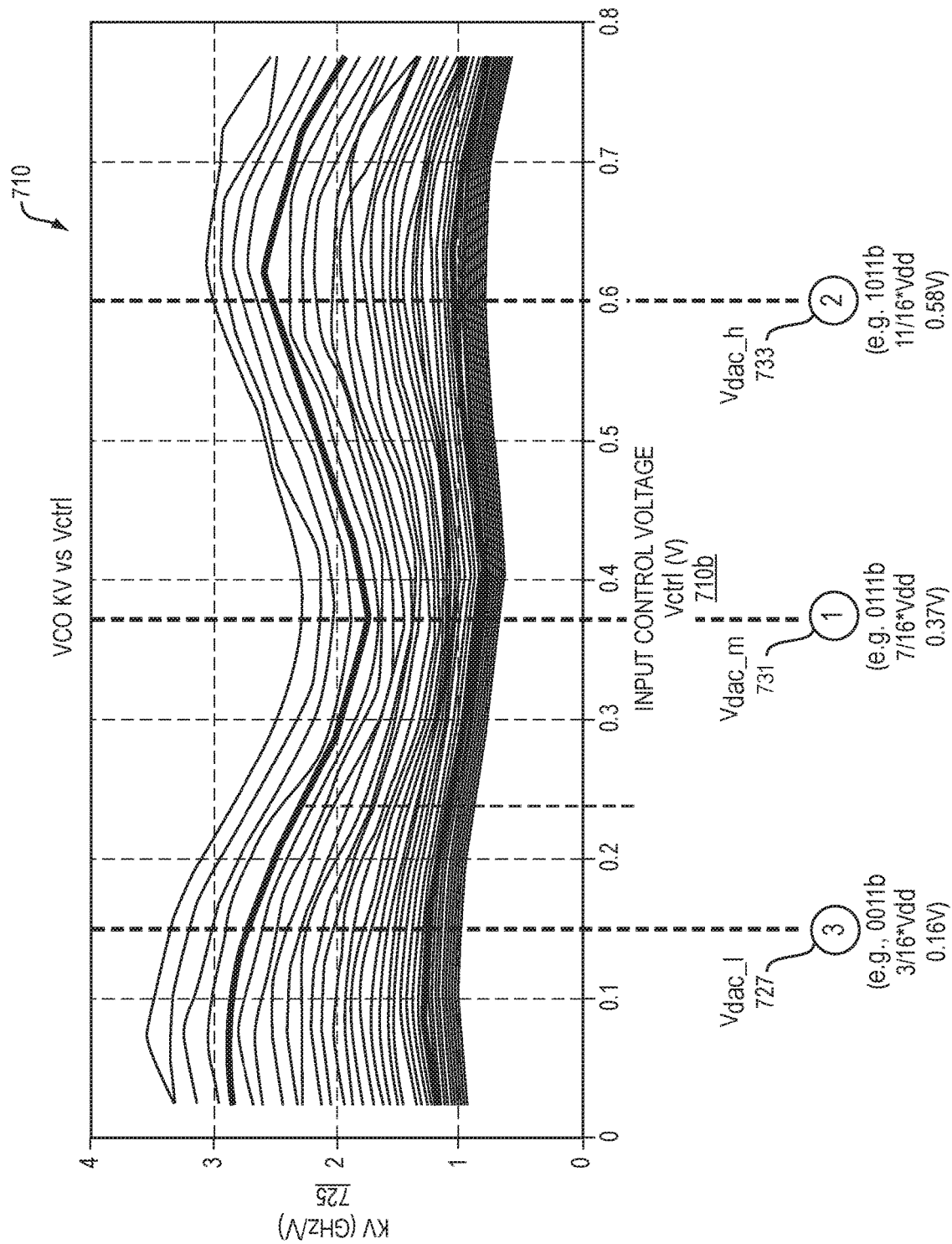
FIG. 7B is a graph of another example embodiment of a voltage-to-frequency gain of a multi-band VCO that results from a given change in the input control voltage.

FIG. 7B is a graph 710a of another example embodiment of a voltage-to-frequency gain 725 (i.e., KV) of a multi-band VCO that results from a given change in the input control voltage 710.

FIG. 5B, disclosed below, discloses a voltage-to-frequency gain 525 for each of the plurality of frequency bands 508 of FIG. 5A for different settings of the digital control voltage value 419.

FIG. 7B is a graph 710 of an example embodiment of a voltage-to-frequency gain 725 (i.e., KV) versus the input control voltage 710b (e.g., Vctrl(V)) for the plurality of frequency bands 708 of FIG. 7A, disclosed above. The graph 710 indicates the voltage-to-frequency gain 725 for each of the plurality of frequency bands 708 for different settings of the digital control voltage value 419 input to the DAC 458 of FIG. 4, disclosed above, namely $V_{dac\_1}$ 727, $V_{dac\_m}$ 731 and $V_{dac\_h}$ 733. Example values for 4-bit values for the digital voltage control value 419 are disclosed for achieving the $V_{dac\_1}$ 727, $V_{dac\_m}$ 731 and $V_{dac\_h}$ 733 values for the input control voltage 410.

FIG. 8A is a graph 800 of an example embodiment of a calibration enable signal 809 over time.

FIG. 8B is a graph 810 of an example embodiment of a reference count value 864 and a divided count value 868 that may generated from the first counter 465 and the second counter 466 of FIG. 4, respectively, over time.

FIG. 8C is a graph 820 of an example embodiment of an input control voltage 810 (i.e., Vctrl) over time. The input control voltage 810 may be generated by the DAC 458 of FIG. 4, disclosed above, and includes $V_{dac\_1}$ 827, $V_{dac\_m}$ 831 and $V_{dac\_h}$ 833 corresponding to the higher voltage value 641, the single input control voltage 624, and the lower voltage value 643 of FIG. 6, respectively, and the $V_{dac\_1}$ 727, $V_{dac\_m}$ 731 and $V_{dac\_h}$ 733 values of FIG. 7B, respectively, disclosed above, and employed for the input control voltage 410.

FIG. 8D is a graph 830 of an example embodiment a digital capacitor selector value 834 over time. As disclosed, the digital capacitor selector value 834 is inversely related to frequency band. For example, a value of 0 for the digital capacitor selector value 834 corresponds to the fastest or the top frequency band whereas a value of 31 for the digital capacitor selector value 834 corresponds to a slowest or bottom frequency band.

The digital capacitor selector value 834 may be configured to the converged digital capacitor selector value 870 that selects the initial frequency band found as a result of the one-point calibration phase, a below band digital capacitor selector value 873 for selecting a lower neighboring frequency band relative to the initial frequency band 870, and an above band digital capacitor selector value 871 for selecting a higher neighboring frequency band relative to the initial frequency band 870. As disclosed above with reference to FIG. 6, in the two-point calibration phase 626, the calibration logic 416 may be further configured to select the optimal frequency band from among the initial frequency band converged on in the one-point calibration phase 622, the higher frequency band, and the lower frequency band. As such, following completion of the calibration, the digital capacitor selector value 834 may be set to the final band digital capacitor selector value 874 that selects the optimal frequency band found from among the initial frequency band converged on in the one-point calibration phase 622, the higher frequency band, and the lower frequency band.

The initial frequency band converged on in the one-point calibration phase may be referred to interchangeably herein as a first frequency band selection, the higher neighboring frequency band may be referred to interchangeably herein as a second frequency band higher in frequency relative to the first frequency band selection, and the lower neighboring frequency band may be referred to interchangeably herein as a third frequency band lower in frequency relative to the first frequency band selection.

FIG. 8E is a graph 840 of an example embodiment of a reference frequency 842 of a reference signal, such as the reference signal 442 if FIG. 4, over time relative to a divided frequency 856 of a divided output signal, such as the divided output signal 456 of FIG. 4, disclosed above.

Figure 9:
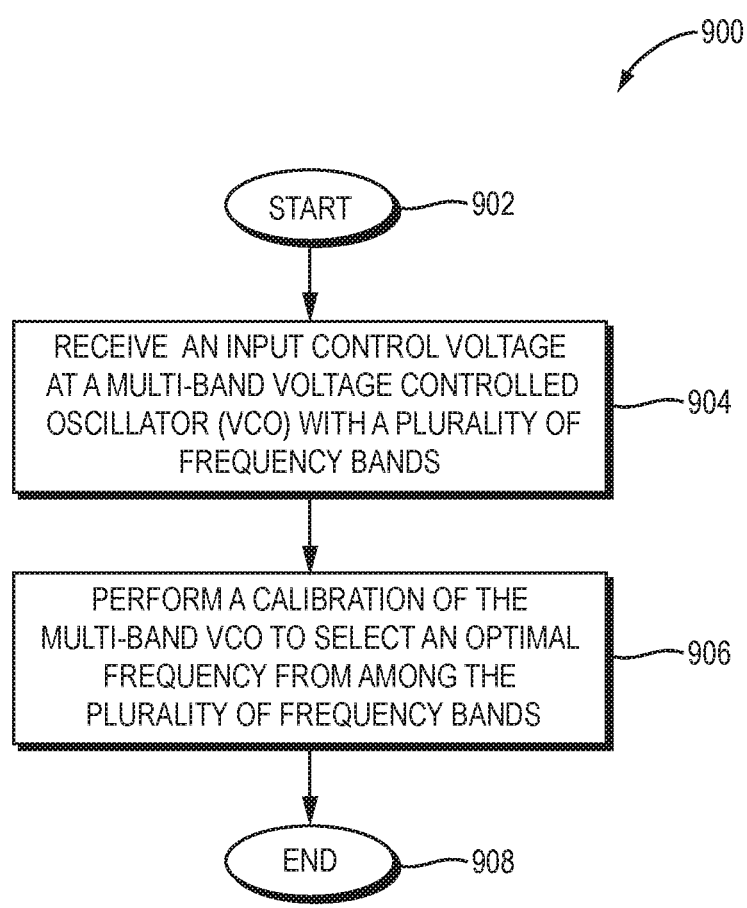
FIG. 9 is a flow diagram of an example embodiment of a method for selecting a frequency band for a multi-band VCO.

FIG. 9 is a flow diagram 600 of an example embodiment of a method for selecting a frequency band for a multi-band voltage controlled oscillator (VCO). The method begins (902) and receives an input control voltage at a multi-band VCO having a plurality of frequency bands, producing an output signal with a target frequency from the multi-band VCO (904). The method performs a calibration of the multi-band VCO to select an optimal frequency band from among the plurality of frequency bands, the calibration including a one-point calibration phase employing a single input control voltage value for the input control voltage followed by a multi-point calibration phase employing multiple input control voltage values for the input control voltage, the optimal frequency band selected as optimal for enabling the multi-band VCO to produce the output signal with the target frequency (906), and the method thereafter ends (908) in the example embodiment.

While example embodiments have been particularly shown and described, it will be understood by those skilled in the art that various changes in form and details may be made therein without departing from the scope of the embodiments encompassed by the appended claims.

What is claimed is:

1. A circuit comprising:
   a multi-band voltage controlled oscillator (VCO) having a plurality of frequency bands, the multi-band VCO configured to receive an input control voltage and produce an output signal with a target frequency; and
   calibration logic configured to perform a calibration of the multi-band VCO to select an optimal frequency band from among the plurality of frequency bands, the calibration including a one-point calibration phase employing a single input control voltage value for the input control voltage followed by a multi-point calibration phase, the multi-point calibration phase including selecting at least three frequency bands of the plurality of frequency bands and, for each respective frequency band of the at least three frequency bands selected, setting multiple input control voltage values for the input control voltage, the optimal frequency band selected as optimal for enabling the multi-band VCO to produce the output signal with the target frequency.

2. The circuit of claim 1, wherein the multi-point calibration phase is a two-point calibration phase employing two input control voltage values for the input control voltage, the two input control voltage values including a higher voltage value and a lower voltage value, the higher voltage value higher in voltage relative to the single input control voltage value employed in the one-point calibration phase and the lower voltage value lower in voltage relative to the single input control voltage value.

3. The circuit of claim 1, wherein, in the one-point calibration phase, the calibration logic is configured to converge on an initial frequency band of the plurality of frequency bands with the input control voltage maintained at the single input control voltage value and wherein, in the multi-point calibration phase, the calibration logic is configured to select the optimal frequency band from among the at least three frequency bands, the at least three frequency bands including the initial frequency band, a higher neighboring frequency band, and a lower neighboring frequency band, the higher neighboring frequency band higher in frequency relative to the initial frequency band and the lower neighboring frequency band lower in frequency relative to the initial frequency band.

4. The circuit of claim 3, wherein, in the one-point calibration phase, the calibration logic is further configured to converge on the initial frequency band using a search criterion.

5. The circuit of claim 4, wherein the search criterion is a binary search and wherein, in the one-point calibration phase, the calibration logic is further configured to begin with a given frequency band of the plurality of frequency bands prior to the binary search, the given frequency band located midway between a highest frequency band and lowest frequency band in a range of frequency bands of the plurality of frequency bands.

6. The circuit of claim 3, wherein, in the multi-point calibration phase, the calibration logic is configured to:
set a given frequency band of the plurality of frequency bands to each of the initial frequency band converged on in the one-point calibration phase, the lower neighboring frequency band, and the higher neighboring frequency band in combination with the input control voltage set to the higher voltage value and the input control voltage set to the lower voltage value.

7. The circuit of claim 1, wherein the multi-band VCO includes a digital capacitor bank acting as a variable capacitor and wherein, in the one-point and the multi-point calibration phases, the calibration logic is configured to select between the plurality of frequency bands by changing a capacitance value of the digital capacitor bank.

8. The circuit of claim 7, wherein the calibration logic is configured to change the capacitance value, electronically, by setting a digital capacitor selector value configured to enable or disable capacitors of the digital capacitor bank on an individual basis.

9. The circuit of claim 1, wherein the one-point calibration phase is performed followed by the multi-point calibration phase in response to a change in the target frequency.

10. The circuit of claim 1, wherein the circuit further comprises a phase-locked loop (PLL), the PLL including the multi-band VCO and configured to receive a reference signal with a reference frequency and further includes a divider circuit configured to divide down a frequency of the output signal by a divide value and wherein the target frequency is changed by changing the divide value, the reference frequency, or a combination thereof.

11. The circuit of claim 1, wherein the circuit further comprises a phase-locked loop (PLL), the PLL including the multi-band VCO, a loop filter, and a divider circuit, the divider circuit configured to divide down a frequency of the output signal to produce a divided output signal, the PLL configured to receive a reference signal, and wherein the circuit still further comprises:
a digital-to-analog converter (DAC) and a first switch configured to enable the DAC to drive the input control voltage in an event the calibration is active;
a second switch configured to enable the loop filter to drive the input control voltage in an event the calibration is inactive;
a first counter configured to receive the reference signal and produce a reference count value therefrom to the calibration logic; and
a second counter configured to receive the divided output signal and produce a divided count value therefrom to the calibration logic.

12. The circuit of claim 11, wherein, in the one-point calibration phase, the input control voltage is maintained at the single input control voltage value via the DAC and the calibration logic is configured to:
set a given frequency band of the plurality of frequency bands and, in response to the reference count value reaching a predetermined reference count, compare the divided count value to the reference count value; and
converge on an initial frequency band by changing the given frequency band set, iteratively, according to a search criterion and comparing the divided count value to the reference count value, iteratively, in response to the reference count value reaching the predetermined reference count, for each change to the given frequency band set.

13. The circuit of claim 12, wherein, in the one-point calibration phase, the given frequency band is set, initially, to a frequency band that is midway between a highest frequency band and a lowest frequency band in a range of frequency bands of the plurality of frequency bands.

14. The circuit of claim 12, wherein the calibration logic is further configured to change a digital capacitor selector value to change the given frequency band, the digital capacitor selector value chosen in accordance with the search criterion.

15. The circuit of claim 11, wherein the multiple input control voltage values are set via the DAC and include a higher voltage value higher in voltage relative to the single input control voltage value employed in the one-point calibration phase and a lower voltage value lower in voltage relative to the single input control voltage value and wherein, in the multi-point calibration phase, the calibration logic is configured to:
set a given frequency band of the plurality of frequency bands to an initial frequency band converged on in the one-point calibration phase;

set the input control voltage value to the higher voltage value and, in response to the reference count value reaching a predetermined reference count, obtain a first divided count value;
set the input control voltage value to the lower voltage value and, in response to the reference count value reaching the predetermined reference count, obtain a second divided count value; and
compute a first average divided count value of the first divided count value and the second divided count value.

16. The circuit of claim 15, wherein, in the multi-point calibration phase, the calibration logic is further configured to:
set the given frequency band to a lower frequency band, the lower frequency band consecutively lower in frequency relative to the initial frequency band;
set the input control voltage value to the higher voltage value and, in response to the reference count value reaching the predetermined reference count, obtain a third divided count value;
set the input control voltage value to the lower voltage value and, in response to the reference count value reaching the predetermined reference count, obtain a fourth divided count value; and
compute a second average divided count value of the third divided count value and the fourth divided count value.

17. The circuit of claim 16, wherein, in the multi-point calibration phase, the calibration logic is further configured to:
set the given frequency band to a higher frequency band, the higher frequency band consecutively higher in frequency relative to the initial frequency band;
set the input control voltage value to the higher voltage value and, in response to the reference count value reaching the predetermined reference count, obtain a fifth divided count value;
set the input control voltage value to the lower voltage value and, in response to the reference count value reaching the predetermined reference count, obtain a sixth divided count value; and
compute a third average divided count value of the fifth divided count value and the sixth divided count value.

18. The circuit of claim 17, wherein, in the multi-point calibration phase, the calibration logic is further configured to:
determine a closest average divided count value to the predetermined reference count from among the first, second, and third average divided count values; and
select the optimal frequency band from among the initial frequency band converged on in the one-point calibration phase, the higher frequency band, and the lower frequency band, the optimal frequency band corresponding to the given frequency band employed to produce the closest average divided count value.

19. A method for selecting a frequency band for a multi-band voltage controlled oscillator (VCO) having a plurality of frequency bands, the method comprising:
receiving an input control voltage at the multi-band VCO and producing an output signal with a target frequency from the multi-band VCO; and
performing a calibration of the multi-band VCO to select an optimal frequency band from among the plurality of frequency bands, the calibration including a one-point calibration phase employing a single input control voltage value for the input control voltage followed by a multi-point calibration phase, the multi-point calibration phase including selecting at least three frequency bands of the plurality of frequency bands and, for each respective frequency band of the at least three frequency bands selected, setting multiple input control voltage values for the input control voltage, the optimal frequency band selected as optimal for enabling the multi-band VCO to produce the output signal with the target frequency.

20. The method of claim 19, wherein the multi-point calibration phase is a two-point calibration phase and wherein the method further comprises employing two input control voltage values for the input control voltage, the two input control voltage values including a higher voltage value and a lower voltage value, the higher voltage value higher in voltage relative to the single input control voltage value employed in the one-point calibration phase and the lower voltage value lower in voltage relative to the single input control voltage value.

21. The method of claim 19, further comprising, in the one-point calibration phase, converging on an initial frequency band of the plurality of frequency bands with the input control voltage maintained at the single input control voltage value and, in the multi-point calibration phase, selecting the optimal frequency band from among the at least three frequency bands, the at least three frequency bands including the initial frequency band converged on in the one-point calibration phase, a higher neighboring frequency band, and a lower neighboring frequency band, the higher neighboring frequency band higher in frequency relative to the initial frequency band and the lower neighboring frequency band lower in frequency relative to the initial frequency band.

22. The method of claim 21, further comprising, in the one-point calibration phase, converging on the initial frequency band using a search criterion.

23. The method of claim 22, wherein the search criterion is a binary search and wherein the method further comprises, in the one-point calibration phase, beginning with a given frequency band of the plurality of frequency bands prior to the binary search, the given frequency band located midway between a highest frequency band and lowest frequency band in a range of frequency bands of the plurality of frequency bands.

24. The method of claim 21, wherein the method further comprises, in the multi-point calibration phase:
setting a given frequency band of the plurality of frequency bands to each of the initial frequency band converged on in the one-point calibration phase, the lower neighboring frequency band, and the higher neighboring frequency band in combination with setting the input control voltage to the higher voltage value and setting the input control voltage to the lower voltage value.

25. The method of claim 19, wherein the method further comprises, in the one-point and the multi-point calibration phases, selecting between the plurality of frequency bands by changing a capacitance value of digital capacitor bank acting as a variable capacitor of the multi-band VCO.

26. The method of claim 25, further comprising changing the capacitance value, electronically, by setting a digital capacitor selector value configured to enable or disable capacitors of the digital capacitor bank on an individual basis.

27. The method of claim 19, further comprising performing the one-point calibration phase followed by the multi-point calibration phase in response to a change in the target frequency.

28. The method of claim 19, further comprising receiving a reference signal with a reference frequency, dividing down a frequency of the output signal by a divide value, and changing the target frequency by changing the divide value, the reference frequency, or a combination thereof.

29. The method of claim 19, further comprising:
dividing down a frequency of the output signal to produce a divided output signal;
receiving a reference signal;
configuring a first switch to couple a digital-to-analog converter (DAC) to enable the DAC to drive the input control voltage in an event the calibration is active;
configuring a second switch to enable a loop filter to drive the input control voltage in an event the calibration is inactive;
receiving the reference signal at a first counter and producing a reference count value therefrom; and
receiving the divided output signal at a second counter and producing a divided count value therefrom.

30. The method of claim 29, further comprising, in the one-point calibration phase:
maintaining the input control voltage at the single input control voltage value via the DAC;
setting a given frequency band of the plurality of frequency bands and, in response to the reference count value reaching a predetermined reference count, comparing the divided count value to the reference count value; and
converging on an initial frequency band by changing the given frequency band set, iteratively, according to a search criterion and comparing the divided count value to the reference count value, iteratively, in response to the reference count value reaching a predetermined reference count, for each change to the given frequency band set.

31. The method of claim 30, further comprising, in the one-point calibration phase, setting the given frequency band, initially, to a frequency band that is midway between a highest frequency band and a lowest frequency band in a range of frequency bands of the plurality of frequency bands.

32. The method of claim 30, further comprising changing a digital capacitor selector value to change the given frequency band and choosing the digital capacitor selector value in accordance with the search criterion.

33. The method of claim 29, further comprising setting the multiple input control voltage values via the DAC, the multiple input control voltage values including a higher voltage value higher in voltage relative to the single input control voltage value employed in the one-point calibration phase and a lower voltage value lower in voltage relative to the single input control voltage value and wherein, in the multi-point calibration phase, performing the calibration includes:
setting a given frequency band of the plurality of frequency bands to an initial frequency band converged on in the one-point calibration phase;
setting the input control voltage value to the higher voltage value and, in response to the reference count value reaching a predetermined reference count, obtain a first divided count value;
setting the input control voltage value to the lower voltage value and, in response to the reference count value reaching the predetermined reference count, obtaining a second divided count value; and
computing a first average divided count value of the first divided count value and the second divided count value.

34. The method of claim 33, wherein, in the multi-point calibration phase, performing the calibration includes:
setting the given frequency band to a lower frequency band, the lower frequency band consecutively lower in frequency relative to the initial frequency band;
setting the input control voltage value to the higher voltage value and, in response to the reference count value reaching the predetermined reference count, obtaining a third divided count value;
setting the input control voltage value to the lower voltage value and, in response to the reference count value reaching the predetermined reference count, obtaining a fourth divided count value; and
computing a second average divided count value of the third divided count value and the fourth divided count value.

35. The method of claim 34, wherein, in the multi-point calibration phase, performing the calibration includes:
setting the given frequency band to a higher frequency band, the higher frequency band consecutively higher in frequency relative to the initial frequency band;
setting the input control voltage value to the higher voltage value and, in response to the reference count value reaching the predetermined reference count, obtaining a fifth divided count value;
setting the input control voltage value to the lower voltage value and, in response to the reference count value reaching the predetermined reference count, obtaining a sixth divided count value; and
computing a third average divided count value of the fifth divided count value and the sixth divided count value.

36. The method of claim 35, wherein, in the multi-point calibration phase, performing the calibration includes:
determining a closest average divided count value to the predetermined reference count from among the first, second, and third average divided count values; and
selecting the optimal frequency band from among the initial frequency band converged on in the one-point calibration phase, the higher frequency band, and the lower frequency band, the optimal frequency band corresponding to the given frequency band employed to produce the closest average divided count value.

37. A circuit comprising:
a multi-band voltage controlled oscillator (VCO) having a plurality of frequency bands, the multi-band VCO configured to receive an input control voltage and produce an output signal with a target frequency;
a phase-locked loop (PLL) configured to receive a reference signal and including the multi-band VCO, a loop filter, and a divider circuit, the divider circuit configured to divide down a frequency of the output signal to produce a divided output signal;
calibration logic configured to perform a calibration of the multi-band VCO to select an optimal frequency band from among the plurality of frequency bands, the calibration including a one-point calibration phase employing a single input control voltage value for the input control voltage followed by a multi-point calibration phase employing multiple input control voltage values for the input control voltage, the optimal frequency band selected as optimal for enabling the multi-band VCO to produce the output signal with the target frequency;

a digital-to-analog converter (DAC), a first switch configured to enable the DAC to drive the input control voltage in an event the calibration is active, and a second switch configured to enable the loop filter to drive the input control voltage in an event the calibration is inactive; and a first counter configured to receive the reference signal and produce a reference count value therefrom to the calibration logic and a second counter configured to receive the divided output signal and produce a divided count value therefrom to the calibration logic.

38. A method for selecting a frequency band for a multi-band voltage controlled oscillator (VCO) having a plurality of frequency bands, the method comprising:

receiving an input control voltage at the multi-band VCO and producing an output signal with a target frequency from the multi-band VCO;

dividing down a frequency of the output signal to produce a divided output signal;

performing a calibration of the multi-band VCO to select an optimal frequency band from among the plurality of frequency bands, the calibration including a one-point calibration phase employing a single input control voltage value for the input control voltage followed by a multi-point calibration phase employing multiple input control voltage values for the input control voltage, the optimal frequency band selected as optimal for enabling the multi-band VCO to produce the output signal with the target frequency;

configuring a first switch to couple a digital-to-analog converter (DAC) to enable the DAC to drive the input control voltage in an event the calibration is active and configuring a second switch to enable a loop filter to drive the input control voltage in an event the calibration is inactive;

receiving a reference signal at a first counter and producing a reference count value therefrom; and receiving the divided output signal at a second counter and producing a divided count value therefrom.

* * * * *

UNITED STATES PATENT AND TRADEMARK OFFICE
CERTIFICATE OF CORRECTION

PATENT NO. : 10,615,746 B2
APPLICATION NO. : 15/825942
DATED : April 7, 2020
INVENTOR(S) : Yildirim et al.

It is certified that error appears in the above-identified patent and that said Letters Patent is hereby corrected as shown below:

In the Specification

Column 8, Line 57, delete "may applied" and insert -- may be applied --, therefor.

Column 10, Line 20, delete "frequency the" and insert -- frequency of the --, therefor.

Column 10, Line 21, delete "divided output signal 448," and insert -- divided output signal 456, --, therefor.

Column 12, Line 54, delete "divider count value 668" and insert -- divided count value 668 --, therefor.

Column 12, Line 58, delete "divider count value 668," and insert -- divided count value 668, --, therefor.

Column 12, Line 63, delete "divider count value 668" and insert -- divided count value 668 --, therefor.

Column 13, Line 5, delete "divider count value 668" and insert -- divided count value 668 --, therefor.

Column 14, Line 7, delete "the any" and insert -- that any --, therefor.

Column 15, Line 31, delete "phase, 626" and insert -- phase 626, --, therefor.

Column 17, Line 48, delete "may generated" and insert -- may be generated --, therefor.

Column 17, Line 53, delete "$V_{dac\_1}$ 827," and insert -- $V_{dac\_1}$ 837, --, therefor.

Column 17, Line 60, delete "embodiment a" and insert -- embodiment of a --, therefor.

Signed and Sealed this
Ninth Day of June, 2020

Andrei Iancu
*Director of the United States Patent and Trademark Office*

Column 18, Line 2, delete "converged digital capacitor selector value 870" and insert -- converged digital capacitor selector value 670 --, therefor.

Column 18, Line 35, delete "diagram 600" and insert -- diagram 900 --, therefor.